(12) United States Patent
Miyazaki et al.

(10) Patent No.: US 10,620,286 B2
(45) Date of Patent: Apr. 14, 2020

(54) MAGNETIC RESONANCE IMAGING APPARATUS AND MAGNETIC RESONANCE IMAGING METHOD

(71) Applicant: CANON MEDICAL SYSTEMS CORPORATION, Otawara-shi (JP)

(72) Inventors: Mitsue Miyazaki, Des Plaines, IL (US); Xiangzhi Zhou, Vernon Hills, IL (US); Aiming Lu, Vernon Hills, IL (US)

(73) Assignee: Canon Medical Systems Corporation, Otawara-shi (JP)

( * ) Notice: Subject to any disclaimer, the term of this patent is extended or adjusted under 35 U.S.C. 154(b) by 835 days.

(21) Appl. No.: 14/979,403

(22) Filed: Dec. 27, 2015

(65) Prior Publication Data

US 2017/0131376 A1 May 11, 2017

Related U.S. Application Data

(60) Provisional application No. 62/252,919, filed on Nov. 9, 2015, provisional application No. 62/261,685, filed on Dec. 1, 2015.

(51) Int. Cl.
*G01R 33/563* (2006.01)
*G01R 33/565* (2006.01)

(52) U.S. Cl.
CPC . *G01R 33/56308* (2013.01); *G01R 33/56509* (2013.01)

(58) Field of Classification Search
CPC ............ G01R 33/563; G01R 33/56308; G01R 33/565; G01R 33/56509; G01R 33/56554; G01R 33/56319; G01R 33/56341
See application file for complete search history.

(56) References Cited

U.S. PATENT DOCUMENTS

2002/0188190 A1* 12/2002 Kassai ................. A61B 5/7285
   600/410
2003/0042905 A1*  3/2003 Miyazaki ........... G01R 33/5635
   324/314

(Continued)

OTHER PUBLICATIONS

Patric Hagmann et al., "Understanding Diffusion MR Imaging Techniques: From Scalar Diffusion-weighted Imaging to Diffusion Tensor Imaging and Beyond", Radio Graphics, vol. 26, Oct. 2006, S205-S223 and Cover page.

(Continued)

*Primary Examiner* — Son T Le
(74) *Attorney, Agent, or Firm* — Oblon, McClelland, Maier & Neustadt, L.L.P.

(57) ABSTRACT

A magnetic resonance imaging apparatus according to an embodiment includes sequence control circuitry and processing circuitry. The sequence control circuitry executes a first pulse sequence and a second pulse sequence, the first pulse sequence including a first spoiler pulse serving as a dephasing gradient pulse of a first amount, the second pulse sequence including a second spoiler pulse serving as a dephasing gradient pulse of a second amount being different from the first amount or the second pulse sequence not including a spoiler pulse serving as a dephasing gradient pulse. The processing circuitry performs a subtraction operation between a first data obtained from the first pulse sequence and a second data obtained from the second pulse sequence, thereby generating an image.

12 Claims, 23 Drawing Sheets

(56) References Cited

U.S. PATENT DOCUMENTS

| | | | | |
|---|---|---|---|---|
| 2010/0013475 A1* | 1/2010 | Kimura | ............... | A61B 5/055 324/307 |
| 2011/0148413 A1* | 6/2011 | Miyazaki | ............ | G01R 33/482 324/309 |
| 2012/0019244 A1* | 1/2012 | Chen | ................. | G01R 33/5602 324/309 |
| 2016/0252596 A1* | 9/2016 | Nielsen | ............... | G01R 33/482 324/309 |

OTHER PUBLICATIONS

Koichi Oshio, "The Basics of Diffusion MRI and Recent Development", from the Internet; the URL is http://jikikyoumei.main.jp/MR143%20suraido.pdf, Oct. 21, 2011, Slide 17-20, 25, 27, 34.

Nathan S. White et al., "Distinct Effects of Nuclear Volume Fraction and Cell Diameter on High b-Value Diffusion MRI Contrast in Tumors", Magnetic Resonance in Medicine, 72, 2014, pp. 1435-1443.

Nadia Aalling Jessen et al., "The Glymphatic System: A Beginner's Guide", Neurochem Res DOI 10.1007/s11064-015-1581-6, 2015, 17 pages.

* cited by examiner

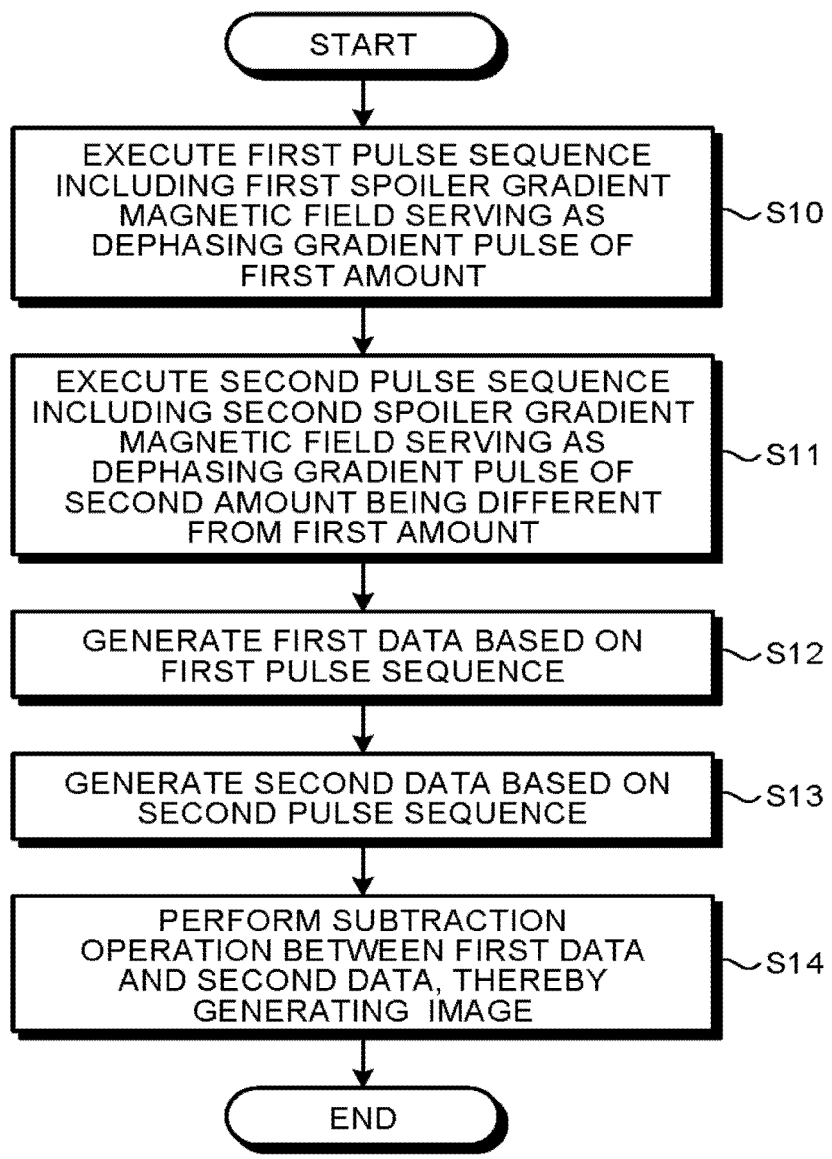

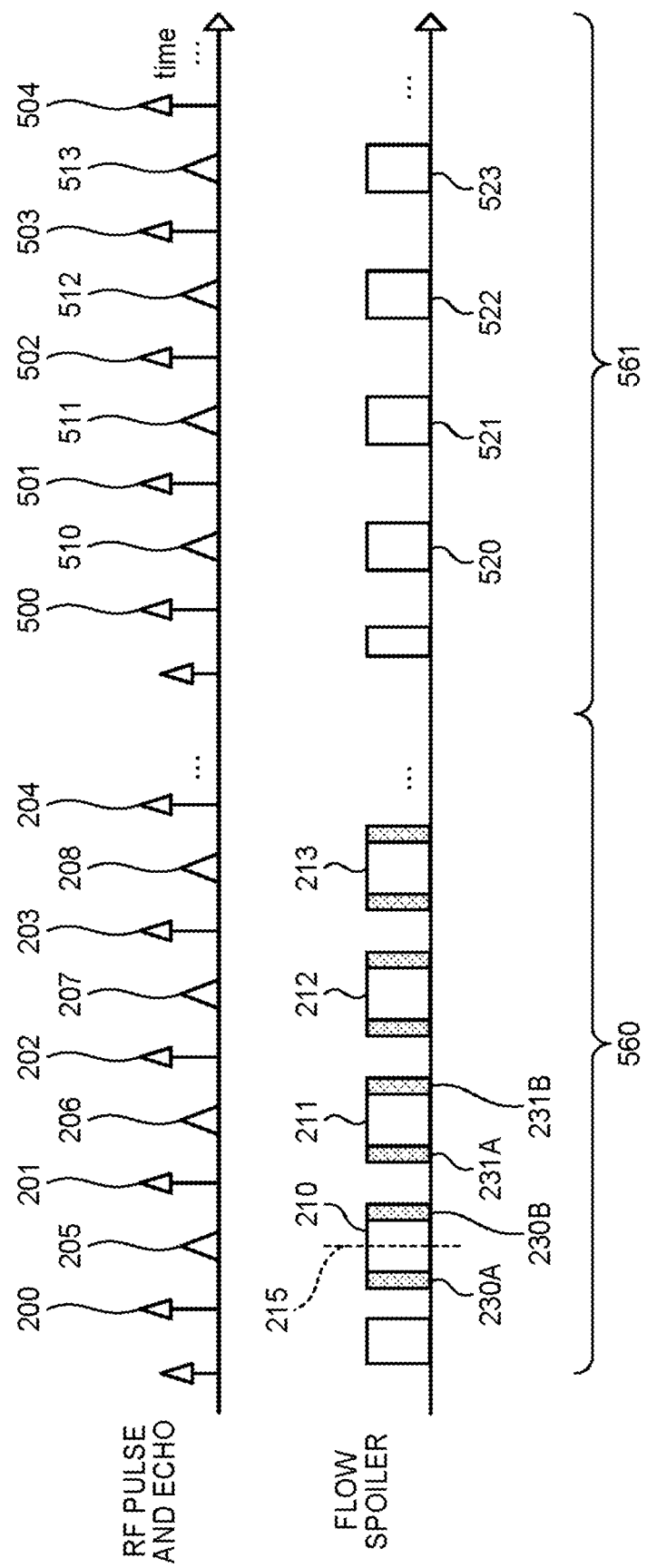

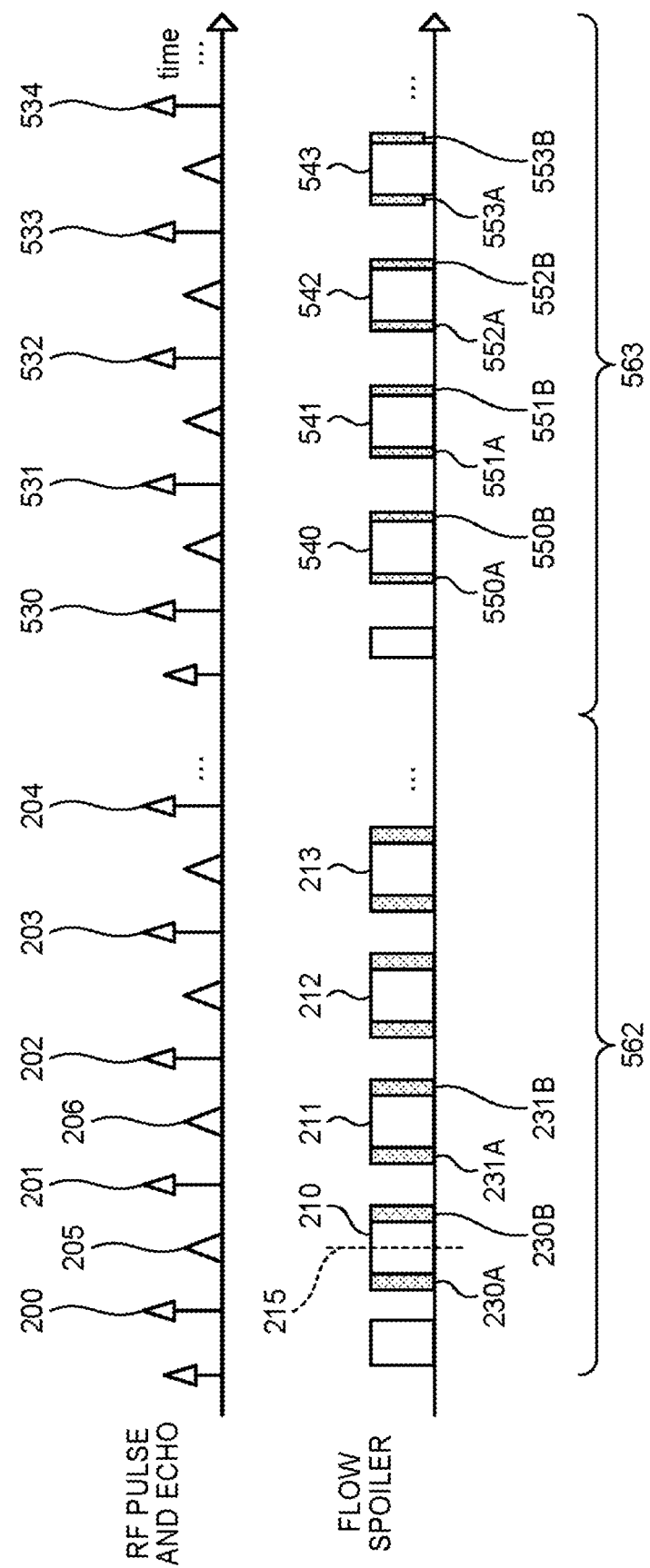

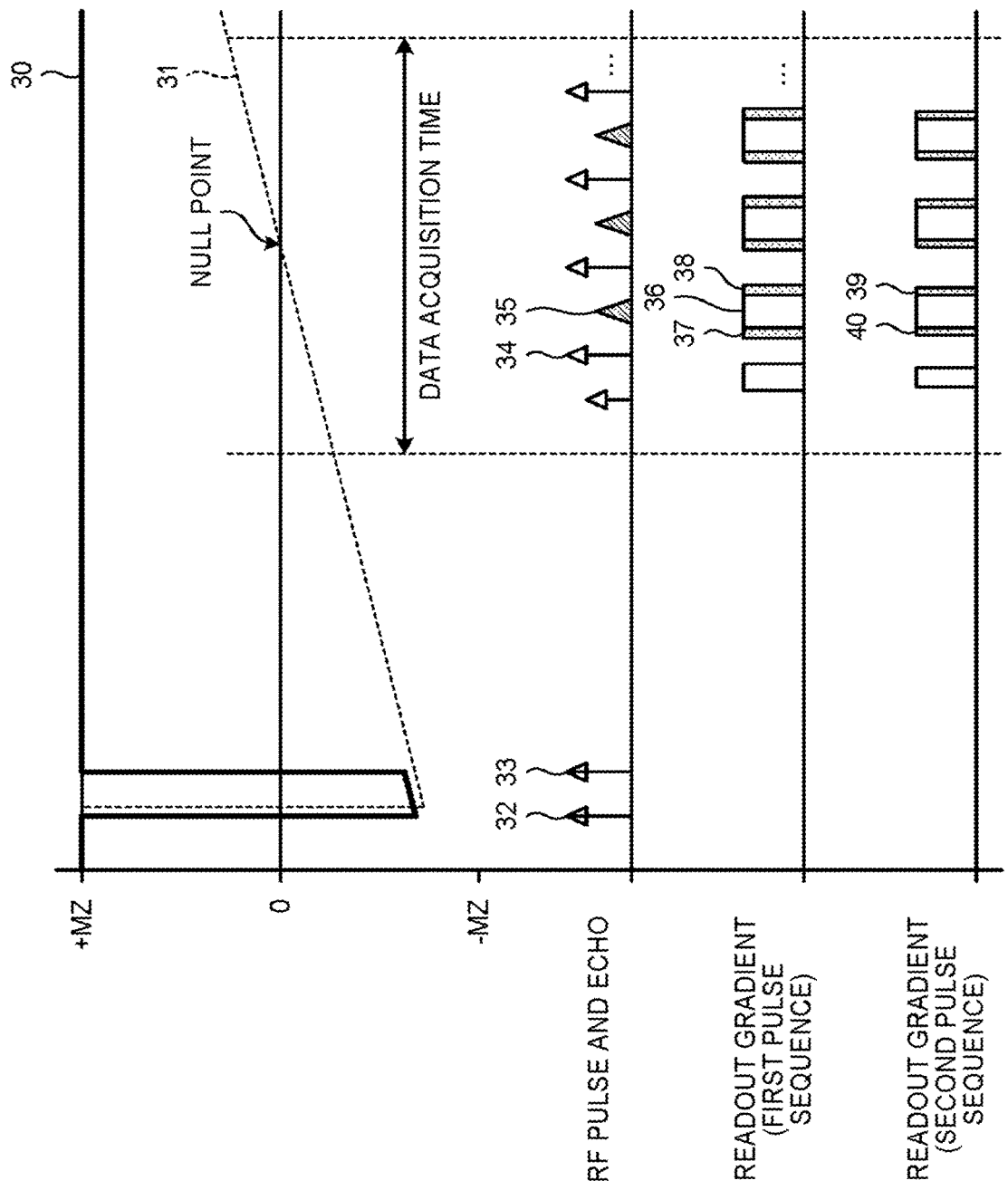

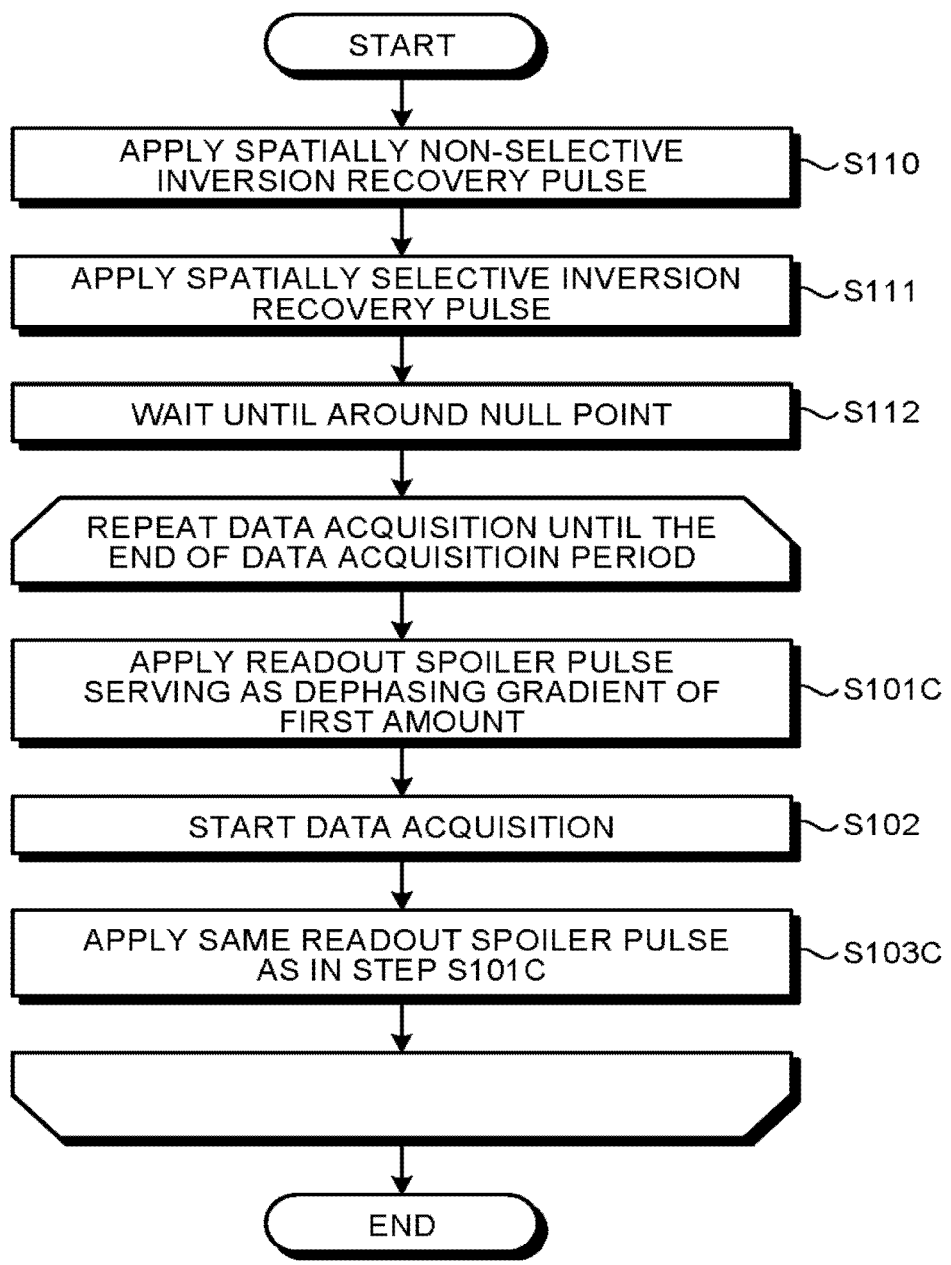

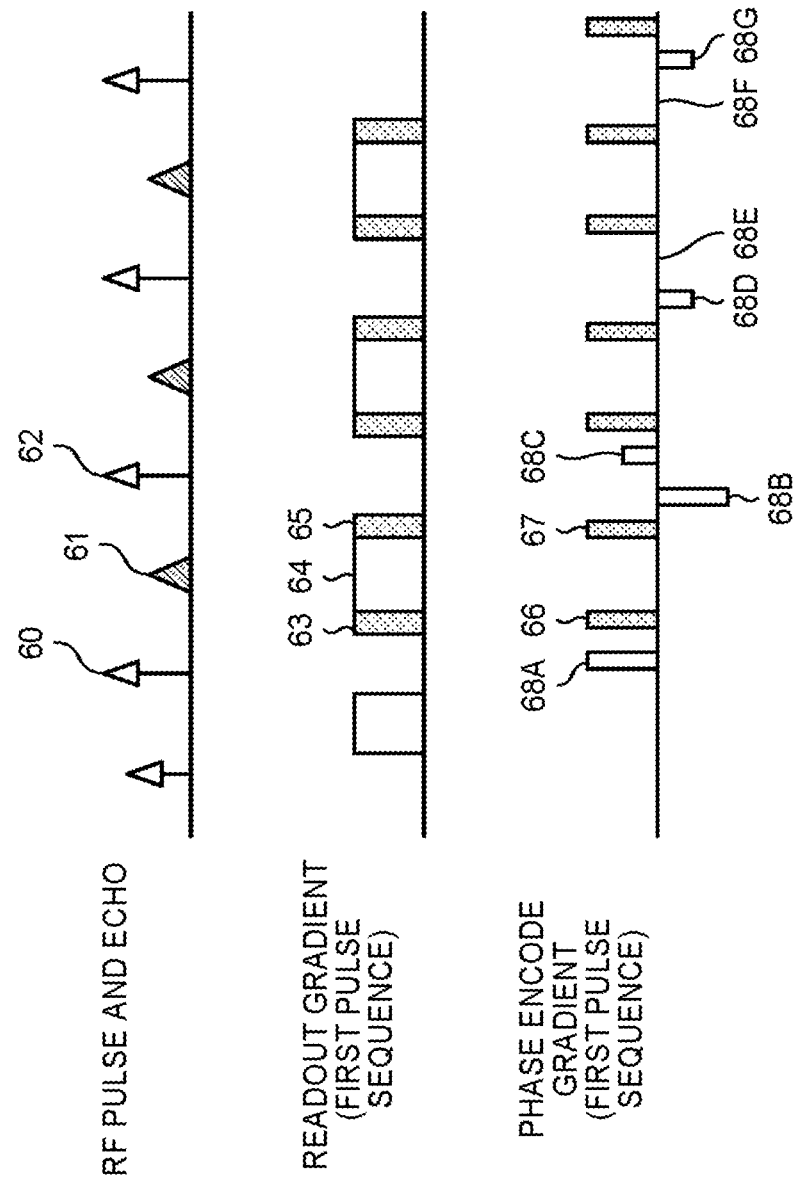

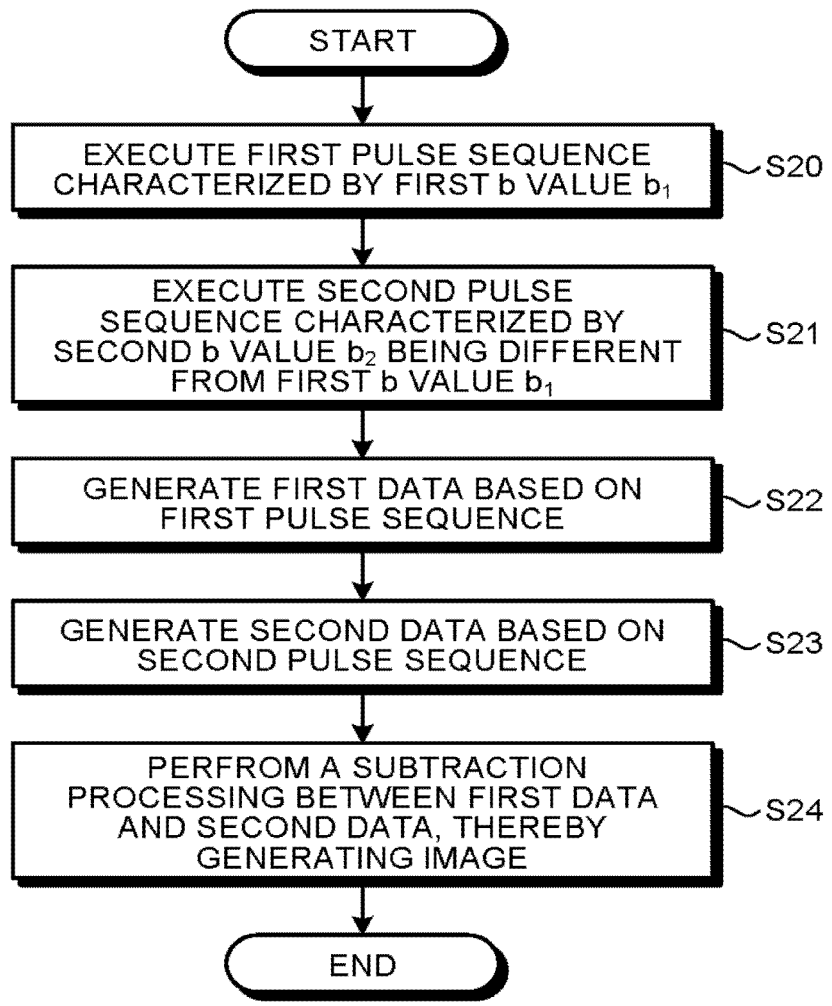

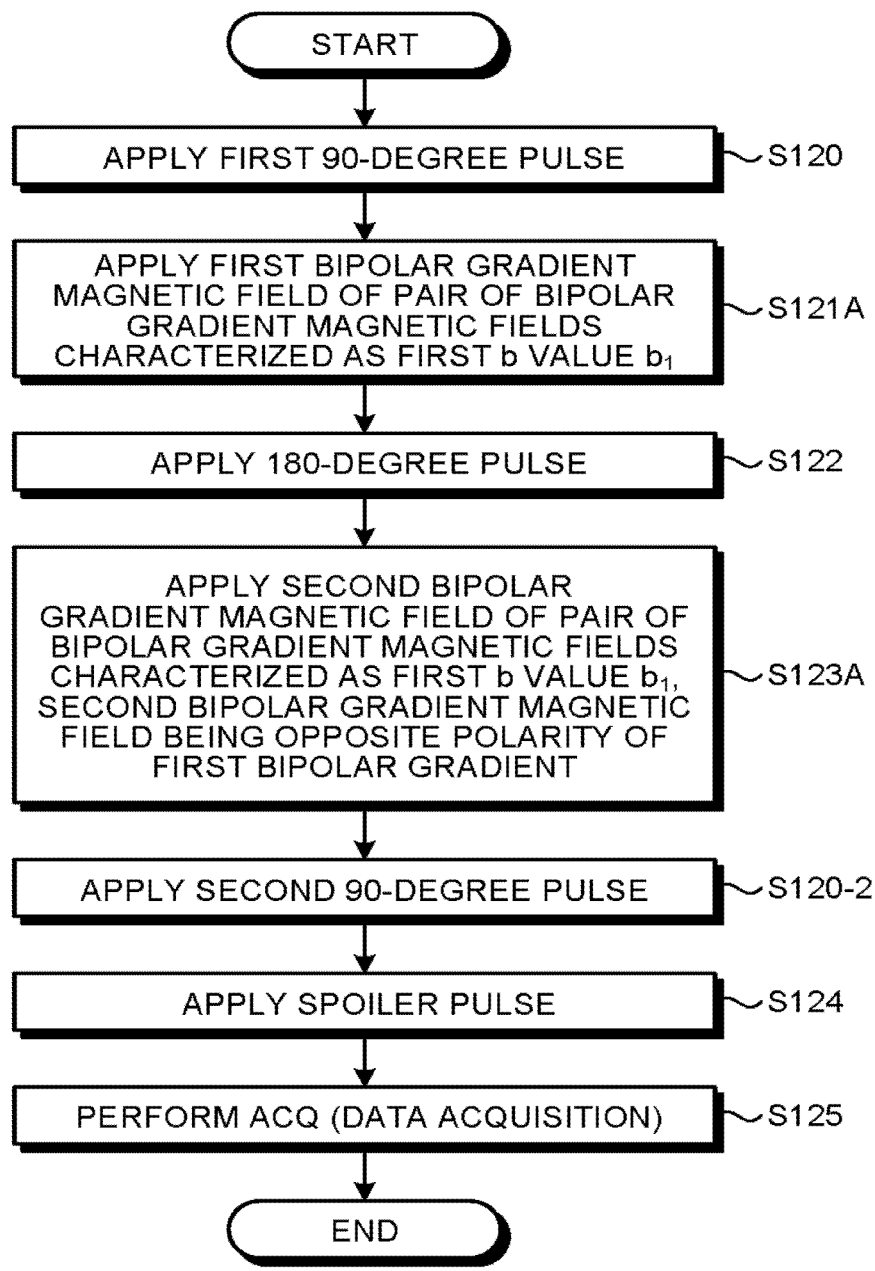

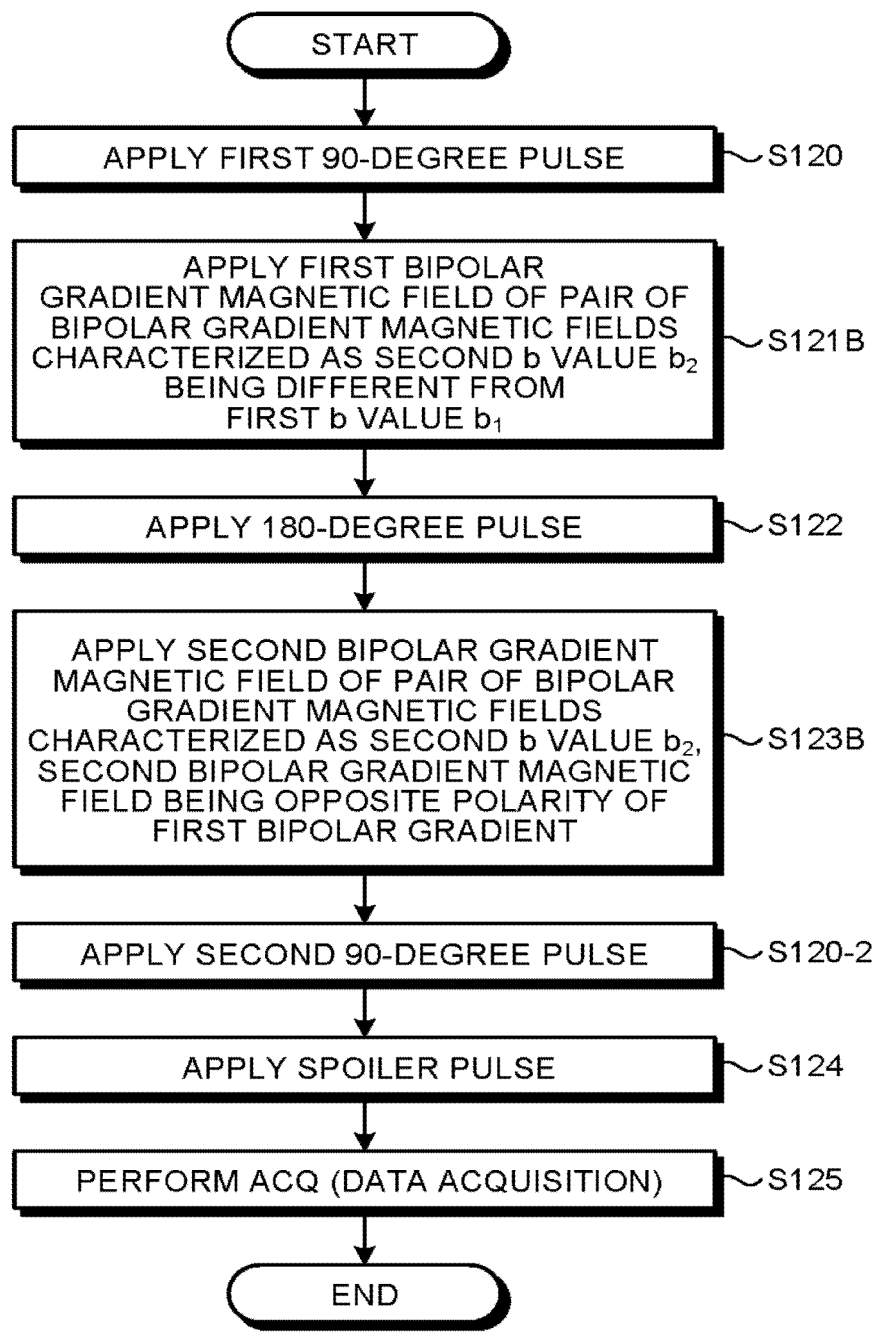

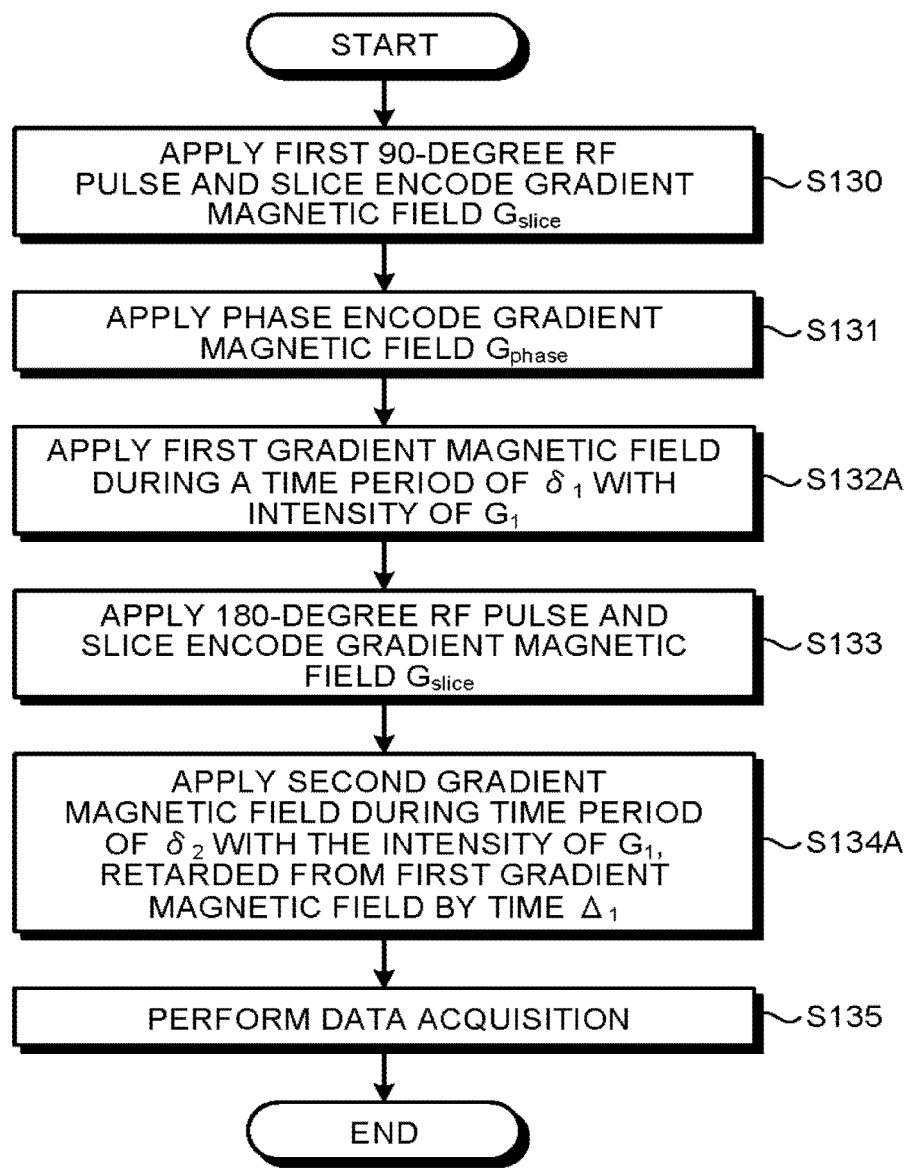

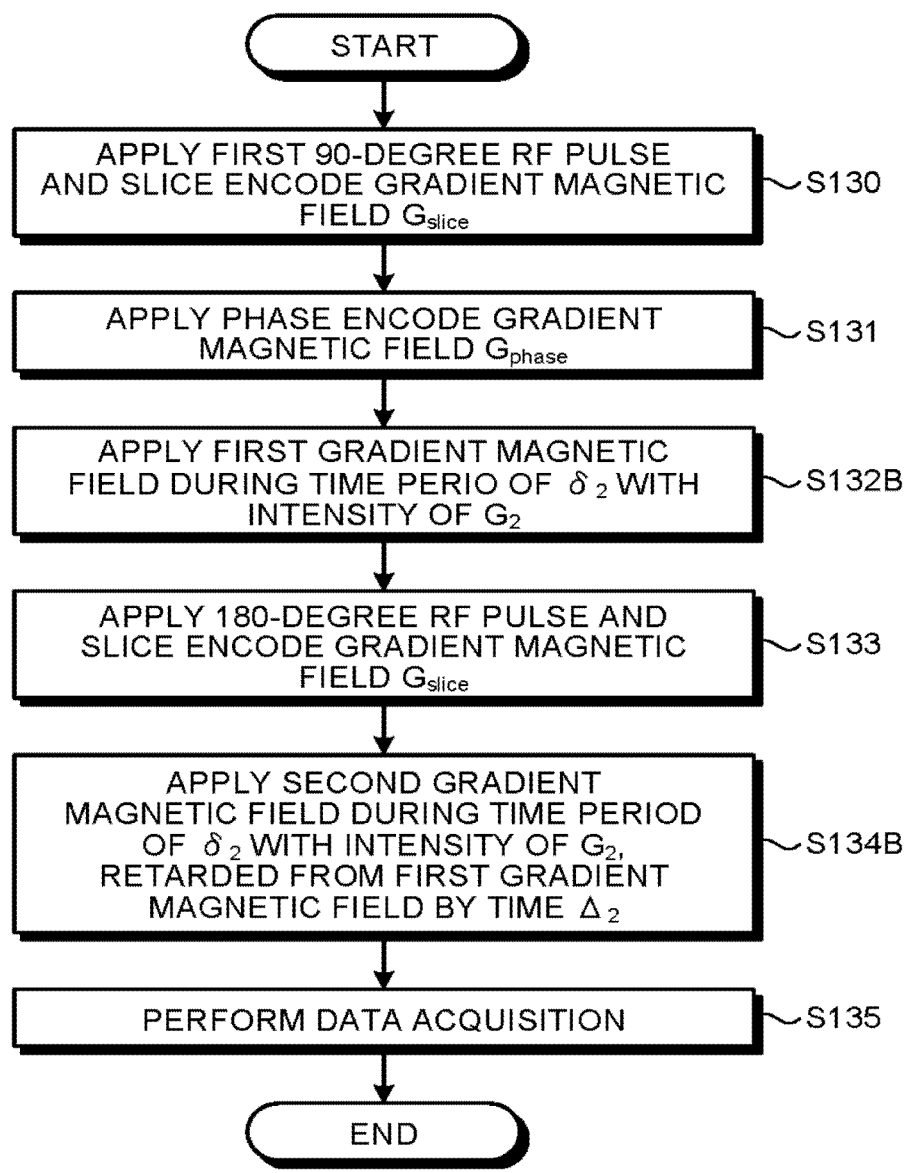

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from U.S. Provisional Application No. 62/252,919, filed on Nov. 9, 2015; and U.S. Provisional Application No. 62/261,685, filed on Dec. 1, 2015; the entire contents of all of which are incorporated herein by reference.

FIELD

Embodiments described herein relate generally to a magnetic resonance imaging apparatus and a magnetic resonance imaging method.

BACKGROUND

In magnetic resonance imaging, motion of directional fluid is depicted, for example, by phase contrast method or diffusion weighted imaging. Movement of protons that is restricted to a specific orientation because of the myelin sheath in the axon, for example, can be depicted using diffusion weighted imaging, with an application of a pulse of a high b-value, such as to the extent of b=1000 to 2000 sec/mm$^2$.

However, as for the production/absorption of CSF (Cerebrospinal Fluid) or proton movement from arteries to veins in the capillary bed, depiction was difficult by these methods.

BRIEF DESCRIPTION OF THE DRAWINGS

FIG. 4 is a flowchart of explaining a procedure of processing performed by a magnetic resonance imaging apparatus according to the first embodiment;

FIG. 5A and FIG. 5B are pulse sequence diagrams illustrating pulse sequences executed by a magnetic resonance imaging apparatus according to the first embodiment;

FIG. 7 is a pulse sequence diagram illustrating a pulse sequence executed by a magnetic resonance imaging apparatus according a first modification example of the first embodiment;

FIG. 8 is a flowchart explaining a procedure of processing performed by a magnetic resonance imaging apparatus according to the first modification example of the first embodiment;

FIG. 10 is a pulse sequence diagram illustrating a pulse sequence executed by a magnetic resonance imaging apparatus according to a second modification example of the first embodiment;

FIG. 11 is a flowchart of explaining a procedure of a processing executed by a magnetic resonance imaging apparatus according to a second embodiment;

FIG. 13A and FIG. 13B are flowcharts of explaining a procedure of processing executed by the magnetic resonance imaging apparatus according to the second embodiment;

FIG. 15A and FIG. 15B are flowcharts illustrating a procedure of processing performed by a magnetic resonance imaging apparatus according to the third embodiment.

DETAILED DESCRIPTION

A magnetic resonance imaging apparatus according to an embodiment includes sequence control circuitry and processing circuitry. The sequence control circuitry executes a first pulse sequence and a second pulse sequence, the first pulse sequence including a first spoiler pulse serving as a dephasing gradient pulse of a first amount, the second pulse sequence including a second spoiler pulse serving as a dephasing gradient pulse of a second amount being different from the first amount or the second pulse sequence not including a spoiler pulse serving as a dephasing gradient pulse. The processing circuitry performs a subtraction operation between a first data obtained from the first pulse sequence and a second data obtained from the second pulse sequence, thereby generating an image.

Exemplary embodiments of a magnetic resonance imaging apparatus and a magnetic resonance imaging method will be explained below with reference to accompanying drawings. Possible embodiments are not limited to exemplary embodiments described below. In principle, the description of each exemplary embodiment is applicable to any other embodiment as well.

First Embodiment

Figure 1:
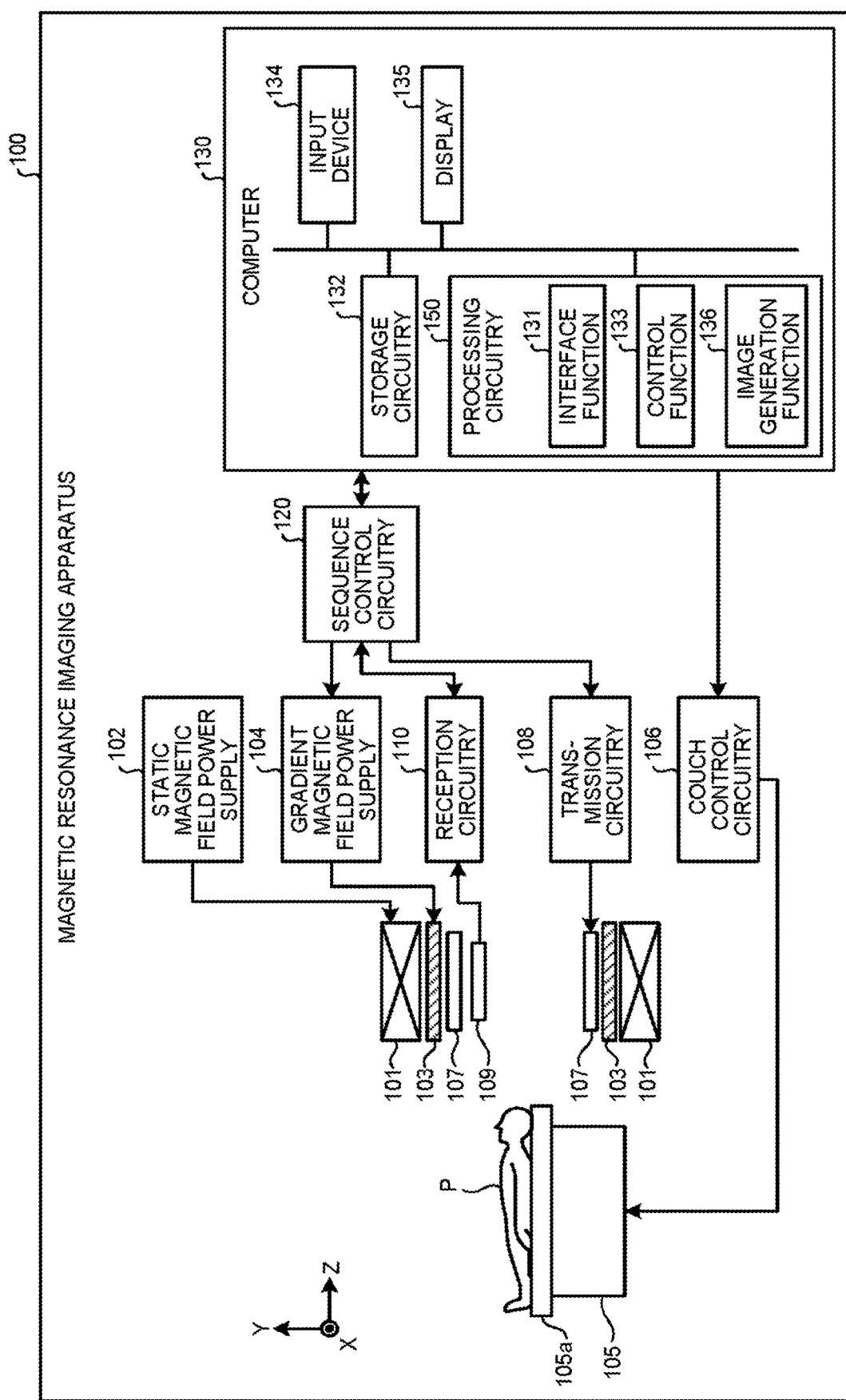
FIG. 1 is a block diagram illustrating a magnetic resonance imaging apparatus according to a first embodiment.

FIG. 1 is a block diagram of a magnetic resonance imaging apparatus 100 according to a first embodiment. As illustrated in FIG. 1, the magnetic resonance imaging apparatus 100 includes a static magnetic field magnet 101, a static magnetic field power source 102, a gradient coil 103, a gradient magnetic field power source 104, a couch 105, couch control circuitry 106, a transmission coil 107, transmission circuitry 108, a reception coil 109, reception circuitry 110, sequence control circuitry 120, and a computer 130 (which may be called an "image processing apparatus"). The magnetic resonance imaging apparatus 100 does not include an examined subject (such as a human body) P. The configuration illustrated in FIG. 1 is merely an example. In another example, any of the unit included in the sequence control circuitry 120 and the computer 130 may be integrated together or separated, as appropriate.

The static magnetic field magnet 101 is a magnet formed in the shape of a substantially hollow circular cylinder and generates a static magnetic field in a space on an inside thereof. The static magnetic field magnet 101 may be configured by using, for example, a superconducting magnet and is magnetically excited by receiving supply of electric current from the static magnetic field power source 102. The static magnetic field power source 102 supplies electric current to the static magnetic field magnet 101. Alternatively, the static magnetic field magnet 101 may be a permanent magnet, in which case the magnetic resonance imaging apparatus 100 need not comprise the static magnetic field power source 102. Further, the static magnetic field power source 102 may be provided separately from the magnetic resonance imaging apparatus 100.

The gradient coil 103 is a coil formed in a shape of a substantially hollow circular cylinder and is disposed on an inside of the static magnetic field magnet 101. The gradient coil 103 is formed by combining three coils corresponding to X-, Y-, and Z-axes that are orthogonal to one another. These three coils individually receive supply of electric current from the gradient magnetic field power source 104 and generate gradient magnetic fields of which the magnetic field intensities change along the X-, Y-, and Z-axes. The gradient magnetic fields on the X-, Y-, and Z-axes that are generated by the gradient coil 103 correspond to, for example, a slice encode gradient magnetic field Gs, a phase encode gradient magnetic field Ge, and a readout gradient magnetic field Gr, respectively. The gradient magnetic field power source 104 supplies the electric current to the gradient coil 103.

The couch 105 includes a couchtop 105a on which the subject P is placed. Under control of the couch control circuitry 106, while the subject P is placed thereon, the couchtop 105a is inserted into a hollow (i.e., an image taking opening) of the gradient coil 103. Normally, the couch 105 is provided so that a longitudinal direction thereof extends parallel to a central axis of the static magnetic field magnet 101. Under control of the computer 130, the couch control circuitry 106 drives the couch 105 so that the couchtop 105a moves in longitudinal directions and in up-and-down directions.

The transmission coil 107 is disposed on an inside of the gradient coil 103 and generates a radio frequency magnetic field by receiving a supply of a radio frequency (RF) pulse from the transmission circuitry 108. The transmission circuitry 108 supplies an RF pulse corresponding to Larmor frequency determined by a type of targeted atoms and magnetic field intensities, to the transmission coil 107.

The reception coil 109 is disposed on an inside of the gradient coil 103 and receives magnetic resonance signals (hereinafter, "MR signals", as necessary) emitted from the subject P subjected to an influence of a radio frequency magnetic field. Upon reception of magnetic resonance signals, the reception coil 109 outputs the received magnetic resonance signals to the reception circuitry 110.

The transmission coil 107 and the reception coil 109 described above are mere examples. The configuration thereof may be realized by selecting one of the following or combining together two or more of the following: a coil having only a transmission function; a coil having only a reception function; and a coil having transmission and reception functions.

The reception circuitry 110 detects the magnetic resonance signals output from the reception coil 109 and generates magnetic resonance data based on the detected magnetic resonance signals. More specifically, the reception circuitry 110 generates the magnetic resonance data by applying a digital conversion to the magnetic resonance signals output from the reception coil 109. Further, the reception circuitry 110 transmits the generated magnetic resonance data to the sequence control circuitry 120. The reception circuitry 110 may be provided on a gantry device side where the static magnetic field magnet 101, the gradient coil 103, and the like are provided.

The sequence control circuitry 120 images the subject P, by driving the gradient magnetic field power source 104, the transmission circuitry 108, and the reception circuitry 110, on the basis of sequence information transmitted from the computer 130. The sequence information is information that defines a procedure of the imaging. The sequence information defines: an intensity of electric current to be supplied from the gradient magnetic field power source 104 to the gradient coil 103 and a timing with which electric current is to be supplied; an intensity of an RF pulse to be supplied by the transmission circuitry 108 to the transmission coil 107 and the timing with which an RF pulse is to be applied; a timing with which magnetic resonance signals are to be detected by the reception circuitry 110, and the like. The sequence control circuitry 120 may be configured with an integrated circuit such as an Application Specific Integrated Circuit (ASIC) or a Field Programmable Gate Array (FPGA) or an electronic circuit such as a Central Processing Unit (CPU) or a Micro Processing Unit (MPU).

Further, upon reception of a magnetic resonance data from the reception circuitry 110 as a result of imaging of the subject P by driving the gradient magnetic field power source 104, the transmission circuitry 108, and the reception circuitry 110, the sequence control circuitry 120 forwards the received magnetic resonance data to the computer 130.

The computer 130 exercises overall control of the magnetic resonance imaging apparatus 100, or generates an image, and the like. The computer 130 comprises storage circuitry 132, an input device 134, a display 135 and processing circuitry 150. The processing circuitry 150 includes an interface function 131, a control function 133 and an image generation function 136.

In the first embodiment, each processing function carried out at the interface function 131, the control function 133, the image generation function 136, is stored in the storage circuitry 132 in a form of an executable program by a computer. The processing circuitry 150 is a processor realizing a function corresponding to each program by reading a program from the storage circuitry 132 and thereafter executing the program. In other words, the processing circuitry 150 in a state of having read each program has each function illustrated within the processing circuitry 150 in FIG. 1. It is noted that, in FIG. 1, it is explained that the single processing circuitry 150 realizes the processing function carried out at the interface function 131, the control function 133, or the image generation function 136. However, a plurality of independent processors may constitute the processing circuitry 150, each processor of the processing circuitry 150 executing its own program. In other words, each function described above may constitute a program and the single processing circuitry may execute each program. Alternatively, a specific function may be implemented in an independent program execution circuitry dedicated for the specific function.

Terminology "processor" used in the above explanation is meant to refer to, for example, CPU (Central Processing Unit), GPU (Graphical Processing Unit), or ASIC (Application Specific Integrated Circuit), circuitry such as programmable logic device (i.e. SPLD (Simple Programmable Logic Device), CPLD (Complex Programmable Logic Device) and FPGA (Field Programmable Gate Array). A processor reads and executes a program stored in the storage circuitry 132, thereby realizing the function.

Further, instead of being stored in the storage circuitry 132, a program may be constructed such that it is directly incorporated within circuitry of a processor. In that situation, the processor realizes a function by reading and executing the program incorporated within the circuitry. The couch control circuitry 106, the transmission circuitry 108, the reception circuitry 110 may be constructed as well, with a use of electronic circuits such as processors described above.

The processing circuitry 150 sends sequence information to the sequence control circuitry 120 by the interface function 131 and receives a magnetic resonance data from the sequence control circuitry 120. Further, upon reception of the magnetic resonance data, the processing circuitry 150 stores the received magnetic resonance data into the storage circuitry 132 by the interface function 131. When receiving the magnetic resonance data, the processing circuitry 150 having the interface function 131 stores the received magnetic resonance data in the storage circuitry 132.

The magnetic resonance data stored in the storage circuitry 132 is arranged into a k-space by the control function 133. As a result, the storage circuitry 132 stores therein a k-space data.

The storage circuitry 132 stores therein the magnetic resonance data received by the processing circuitry 150 that has the interface function 131, the k-space data arranged in the k-space by the processing circuitry 150 having the control function 133, an image data generated by the processing circuitry 150 having the image generation function 136, and the like. For example, the storage circuitry 132 is configured by using a Random Access Memory (RAM), a semiconductor memory element such as a flash memory, a hard disk, an optical disc, and the like.

The input device 134 receives various types of instructions and inputs of information from an operator. For example, the input device 134 is a pointing device such as a mouse or a trackball, a selecting device such as a mode changing switch, or an input device such as a keyboard. Under the control of the processing circuitry 150 that has the control function 133, the display 135 displays Graphical User Interface (GUI) used for receiving an input of an image taking condition and an image generated by the processing circuitry 150 that has the image generation function 136, and the like. For example, the display 135 is a display device such as a liquid crystal display device.

The processing circuitry 150 exercises overall control of the magnetic resonance imaging apparatus 100 by the control function 133 and controls image capturing processing, image generation processing, image display processing, and the like. For example, the processing circuitry 150 that has the control function 133 receives an input of the image taking condition (e.g., an image taking parameter) via the GUI and generates sequence information according to the received image taking condition. Further, the processing circuitry 150 that has the control function 133 transmits the generated sequence information to the sequence control circuitry 120.

The processing circuitry 150 reads a k-space data from the storage circuitry 132 by the image generation function 136 and generates an image through a reconstructing process such as Fourier transform on the read k-space data.

Next, background of a magnetic resonance imaging apparatus according to an embodiment is briefly explained. In magnetic resonance imaging, motion of a directional flow can be depicted with a use of phase contrast method or diffusion weighted imaging method. With phase contrast method, motion correlating with phase dispersion can be depicted by applying motion sensitizing gradients that emphasize signal intensity of motion. Diffusion weighted imaging is similar to phase contrast method regarding proton motions. In diffusion weighted imaging, pulse sequences having b values are applied in order to depict protons whose motion is restricted, such as water proton moving along axon fibers. On the contrary, in order to depict protons whose motion is not restricted, pulse sequences having low b values are employed.

However, it is not easy to depict small motion of water protons the motion of which is not restricted but which are being produced or being absorbed. In particular, depiction of CSF produced at choroid plexus is difficult partly because water molecules produced at choroid plexus flows into the lateral ventricle where CSF waters exist.

Figure 2:
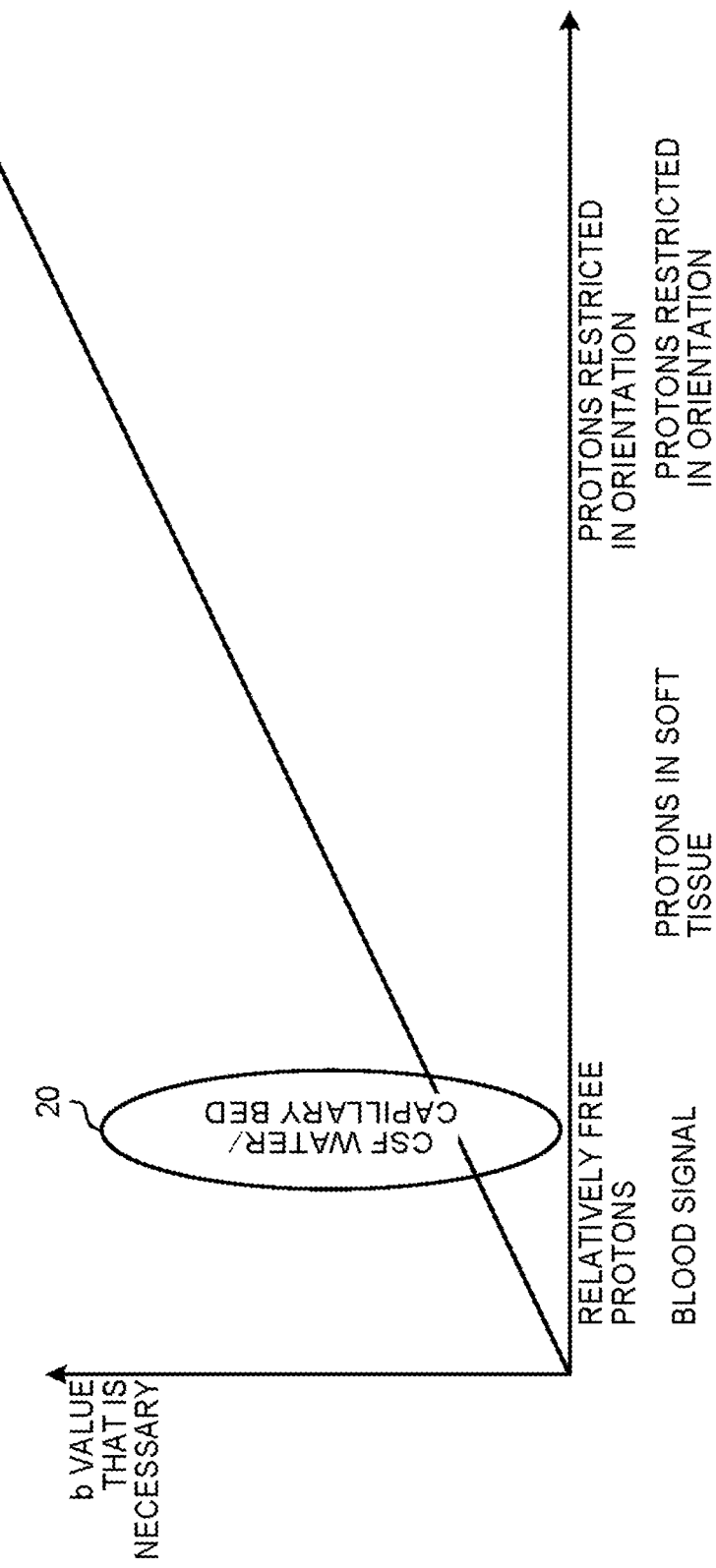
FIG. 2 and FIG. 3 are drawings of explaining technical background of the first embodiment.
Figure 3:
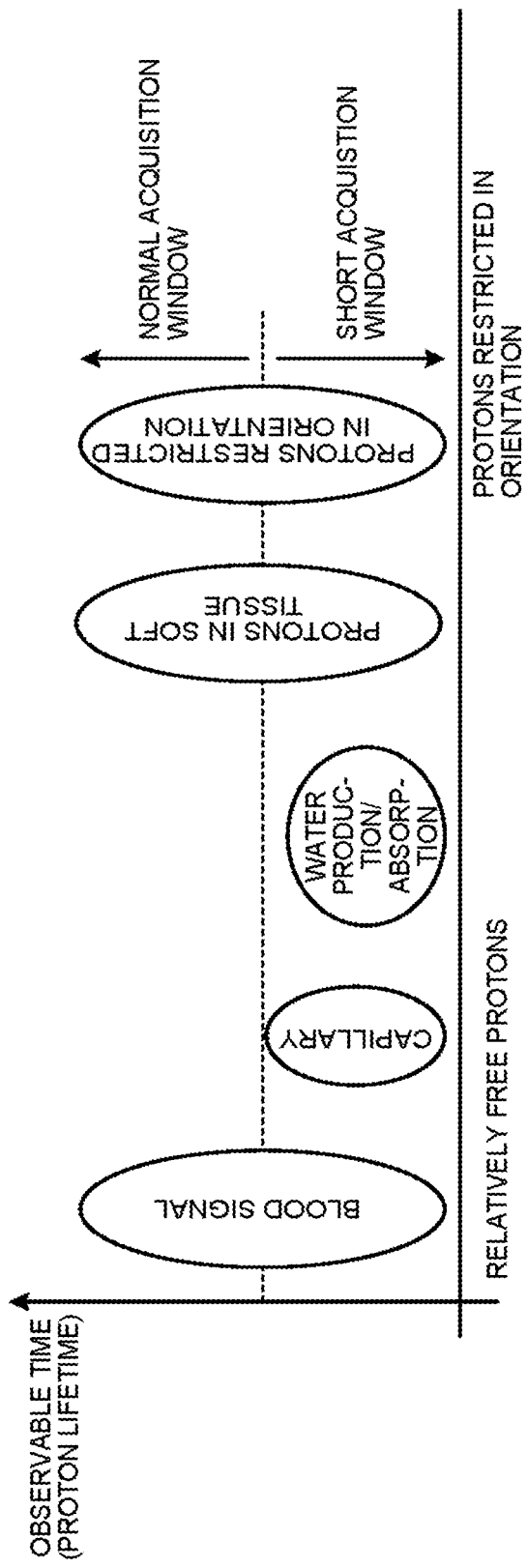

This situation will be explained, with reference to FIG. 2 and FIG. 3 as appropriate. FIG. 2 and FIG. 3 are drawings illustrating technical background of a magnetic resonance imaging apparatus according to the first embodiment.

As a fundamental theory of diffusion weighted imaging, there is an equation known as the Bloch-Torrey equation. The Bloch-Torrey equation is an equation in which a term called diffusion tensor D is added to the Bloch equation, which describes the time evolution of a classical magnetization. The Bloch-Torrey equation has a solution that the magnetization M is proportional to exp(−b*D), where b is the b value, and D is the diffusion coefficient.

The b value is a quantity one can derive from the parameters of a pulse sequence. For example, when two MPG (Motion Probe Gradient) pulses are applied along the readout direction, the b value is given as $b=\gamma^2 G^2 \delta^2 (\Delta-\delta/3)$, where $\gamma$ is the gyromagnetic ratio, G is an intensity of the gradient magnetic field, $\delta$ is the application time duration of the MPG pulse and $\Delta$ is the application interval of the MPG pulses. In other words, the larger the intensity of the gradient magnetic field G, the larger does the b value become. Further, the longer the application time duration $\delta$ of the MPG pulse, the larger does the b value become. Further, the larger does the application interval $\Delta$ of the MPG pulses become, the larger does the b value become. As the diffusion coefficient D is a coefficient intrinsic to a material of an object to be imaged, when performance of the magnetic resonance imaging is assumed to be constant, the b value may be small when the diffusion coefficient D is large (in other words, protons move fast). On the contrary, it is preferable that the b value of a pulse sequence be large, when the diffusion coefficient D is small (in other words, protons move slowly). Further, the Bloch-Torrey equation stipulates that the application interval $\Delta$ of the MPG pulses does not influence the imaging performance on condition that the b values of the pulse sequences are equal.

FIG. 2 is a drawing illustrating the relation between the object to be imaged and the b value that is necessary in order to image the object to be imaged, based on this theory of diffusion weighted imaging. The horizontal axis represents an extent to which protons move easily, in other words, an amount of the diffusion coefficient D. For example, the left region in FIG. 2 indicates a case where protons are relatively free protons, in other words, a case where the diffusion coefficient D is large. The right region in FIG. 2 indicates a case in which protons are restricted in orientation, in other words, a case in which the diffusion coefficient D is small. As indicated in the figure, blood signals are classified as relatively free protons. Protons restricted in orientation are to be disposed on the right end of the horizontal axis in FIG. 2. Protons in soft tissues are considered to be placed between the relatively free protons and the protons restricted in orientation.

The vertical line in FIG. 2 represents the b value necessary for imaging. As described, relatively free protons have large diffusion coefficient D, hence the b value that is necessary for imaging is considered to be small. On the contrary, protons restricted in orientation have small diffusion coefficients D, hence the b value that is necessary for imaging is considered to be large.

Next, let us consider depiction of production of CSF in choroid plexus. As illustrated in an ellipse 20, CSF water or protons in capillary bed (proton being in production/absorption that has no geometrically restricted orientation in particular) are considered to be classified in FIG. 2 as "relatively free protons". Therefore, simply in accordance with the above-described theory it seems at first sight that any pulse sequence having the b value larger than the b value that is necessary for "relatively free protons" is satisfactory in depicting production of CSF water. However, this is not true. In fact, depiction of production of CSF in choroid plexus was never possible.

For one reason, discussion on the Bloch-Torrey equation has been too simplified, therefore inapplicable to actual complicated pulse sequences and real environment in vivo. Consequently, it is not clear what b value should be used in depicting production of CSF, for example, in choroid plexus. Further, even if the b values of the pulse sequences are the same, a pulse sequence having a large gradient magnetic field intensity G and a pulse sequence having a long MPR pulse application interval Δ behaves differently in reality. However, for the biggest reason, "the lifetime", in other words, the observable time was not taken into consideration seriously. Accompanied by diffusion, particles that are the object to be imaged dissipates. However, restricted protons are geometrically restricted in orientation. Thus, restricted protons tend to be confined within the predetermined spatial region. Hence, restricted protons become relatively less dissipative. On the other hand, relatively free protons have no geometrically restricted orientations and become dissipative. Thus, in some cases, it is preferable that a data acquisition start be early.

As a result, as for production of CSF in choroid plexus, dissipation of protons is relatively large while proton lifetime is ephemeral. Therefore, it is preferable that the fact that an observable time is to be small be considered. As a result, for example, it is preferable that a first time be sufficiently small, where the first time is a time since a center time of a time of application of a first MPG pulse and time of application of a second MPG pulse until a time of a start of data acquisition of a central k-space. Here, the time of application of the first MPG pulse is, for example, a time obtained by adding up a time of start of application of the first MPG pulse and a time of end of application of the first MPG pulse and halving the result. Further, the time of application of the second MPG pulse is, for example, a time obtained by adding up a time of start of application of the second MPG pulse and a time of end of application of the second MPG pulse and halving the result.

If an MPG pulse is temporally changing, the time of application of an MPG pulse is the time of "the center of mass". When the diffusion coefficient of a fluid to be depicted is below 1 μm²/msec and when the lifetime of the depicted protons are not more than 5 to 10 msec, it is preferable that a time until a time of start of data acquisition of a central k-space be short.

FIG. 3 illustrates this situation. The horizontal line in FIG. 3 represents an extent to which movement of protons is restricted, in a similar manner as in FIG. 2. On the left end of the FIG. 3 lie relative free protons and on the right end lie protons restricted in orientation. As illustrated in FIG. 3, movement of protons is relatively free in the following order: blood signals, capillaries, production/absorption of water, protons in soft tissue, and protons restricted in orientation. The vertical line of FIG. 3 illustrates an observable time of protons (lifetime of protons). As illustrated in FIG. 3, compared to blood signals, protons in soft tissue, and protons restricted in orientation, observable time becomes short when observing capillary or production/absorption of water. Thus, it is preferable that the sequence control circuitry 120 execute a pulse sequence having a short acquisition window compared to normal situation. Here, an acquisition window of a pulse sequence is a time since a center time of a time of application of the first MPG pulse and a time of application of the second MPG pulse until a time of start of data acquisition of a central k-space data. In other words, it is preferable that the sequence control circuitry 120 start data acquisition of a central k-space data quickly after applications of the MPG pulses.

The observable time can be roughly estimated, for example, based on the Einstein-Smoluchowski equation. According to the Einstein-Smoluchowski equation, $D=\lambda^2/2t$, where D is the diffusion coefficient, $\lambda$ is a distance traveled by a diffusing particle during a time period of t. From this equation, an observable time can be estimated as $t=\lambda^2/2D$. In other words, the sequence control circuitry 120 applies a first MPG pulse and a second MPG pulse at a timing in which a first time is shorter than a second time, the first time being a time since a center time of a time of application of a first MPG pulse and a time of application of a second MPG pulse until a time of start of data acquisition of a central k-space, the second time being a time determined based on the ADC (Apparent Diffusion Coefficient) of a material to be imaged and the Einstein-Smoluchowski equation. The time until the time of start of data acquisition of a central k-space data is chosen to be, for example, several milliseconds.

In the first embodiment, the sequence control circuitry 120 executes a first pulse sequence and a second pulse sequence, the first pulse sequence including a first spoiler pulse serving as a dephasing gradient pulse of a first amount, the second pulse sequence including a second spoiler pulse serving as a dephasing gradient pulse of a second amount or the second pulse sequence not including a spoiler pulse serving as a dephasing gradient pulse. Next, by the image generation function 136, the processing circuitry 150 performs a subtraction operation between a first data obtained from the first pulse sequence and a second data obtained from the second pulse sequence, thereby generating an image. Regarding the above-mentioned points, technical background will be briefly given.

A spoiler pulse is a gradient magnetic field for dephasing transverse components of a magnetization. As for a usage of spoiler pulses, it is a normal usage for spoiler pulses to be used prior to data acquisition in order to eliminate unexpectedly remaining transverse magnetization components due to non-uniformity of a magnetic field in an apparatus. However, in this embodiment, different from this usage, the sequence control circuitry 120 applies a spoiler pulse immediately before the data acquisition, in order to take advantage of the property that spoiler pulses serve as a dephasing gradient pulse. Consequently, the magnetic resonance imaging apparatus 100 according to an embodiment depicts a diffusion effect of protons.

Diffusion phenomena being aside for a while, for example in a case a flow has a large net momentum in a particular direction, such as an arterial flow, the degree of dephasing is different depending on the flow velocity. For example, if a flow velocity is large, the degree of dephasing is large. On the other hand, if a flow velocity is small, the degree of dephasing is small. Thus, the flow velocity can be estimated through measurement of the degree (the amount) of dephasing. To advance this idea a step forward, for example in diffusion phenomena, even if there is no clear net macroscopic momentum, protons being diffused should have some sort of "motion". Thus, it is expected that the degree of dephasing ensued by a spoiler pulse is receptive to the diffusivity of protons being diffused. In other words, an echo generated in a pulse sequence is an echo corresponding to an intensity of the spoiler pulse. Furthermore, the sequence control circuitry 120 applies spoiler gradients in the RO (Readout) direction, by changing an intensity of a spoiler pulse or an application time duration and the like each, thereby executing two pulse sequences. Thereafter, the processing circuitry 150 performs a subtraction operation between the two data obtained from the two pulse sequences. The processing circuitry 150 having the image generation function 136 eliminate stationary components by executing two pulse sequences by changing an intensity of spoiler pulses, the application time duration and the like, and thereafter performing a subtraction operation.

A spoiler pulse and an MPG pulse are considered to have some sort of similarities. As described above, it is preferable that the time since the center time of the MPG pulses until the time of start of data acquisition of the central k-space be short in order to depict production of CSF in choroid plexus. Some sort of similarities between an spoiler pulse and an MPG pulse being considered, in a pulse sequence applied at a first embodiment, it may be considered that a time since a center time of a first spoiler pulse (the center time of a time of start of application of a spoiler pulse and a time of end of application of a spoiler pulse) until a time of start of data acquisition of a central k-space data acquisition corresponds to a time since a center time of MPG pulses until a time of start of data acquisition of a central k-space data. It is possible to apply a spoiler pulse immediately before a time of start of data acquisition of a central k-space. Therefore, in a pulse sequence of the first embodiment, the similar effect as a time since a center time of MPG pulses until a time of start of data acquisition of a central k-space is shortened in effect is expected to occur. As a specific example of this pulse sequence, the sequence control circuitry 120 executes, for example, FASE (Fast Asymmetric Spin Echo) sequence. For normal FASE data acquisition, each echo lasts approximately 1 msec (256×4 μsec of pitch). Thus, the magnetic resonance imaging apparatus according to an embodiment can depict micro fluid motion that is below 1 μm$^2$/ms.

These points considered, the sequence control circuitry 120, for example, executes a first pulse sequence and a second pulse sequence (to be described later) with a brain being an object to be imaged. The processing circuitry 150 generates, by the image generation function 136, the image depicting CSF produced at choroid plexus. Further, the sequence control circuitry 120 may choose another object as the object to be imaged. In such a case, processing circuitry 150 may generate an image depicting at least one of lymph fluid, interstitial fluid, proton movement from arteries to veins at capillary bed.

Figure 6A:
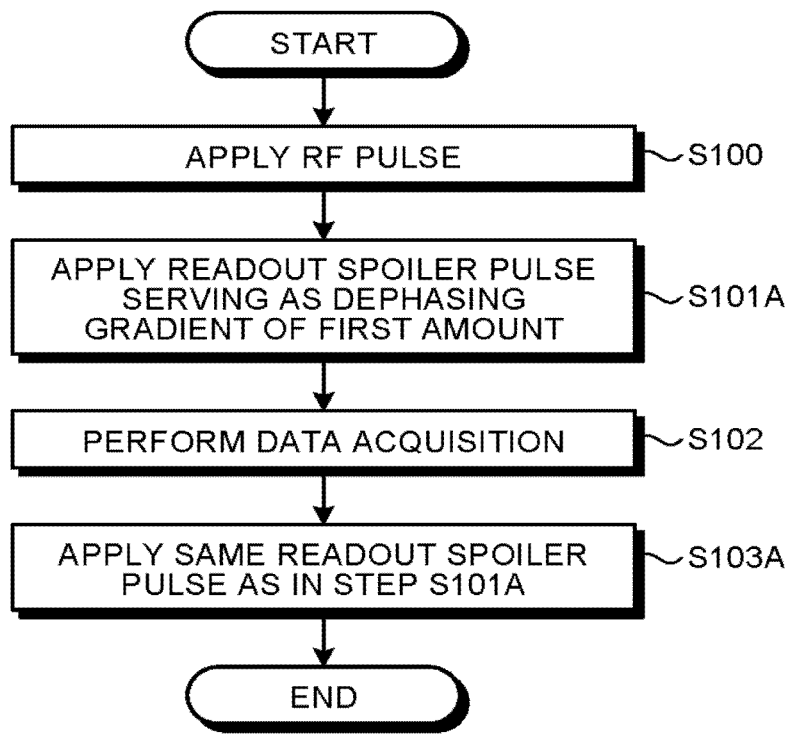
FIG. 6A, FIG. 6B, and FIG. 6C are flowcharts of explaining procedures of processing performed by a magnetic resonance imaging apparatus according to the first embodiment.
Figure 6B:
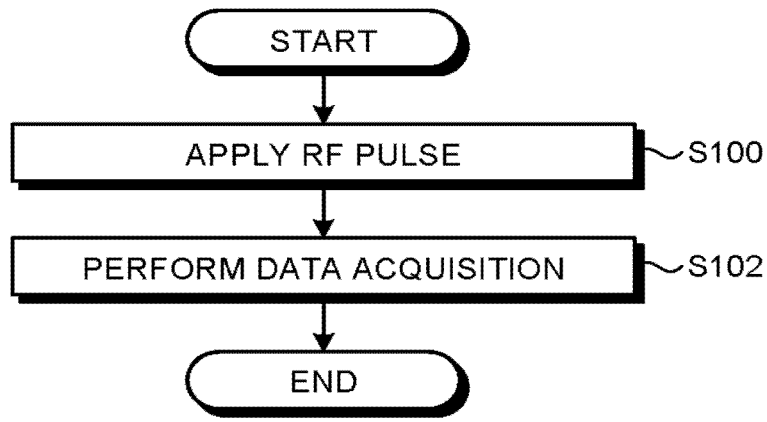
Figure 6C:
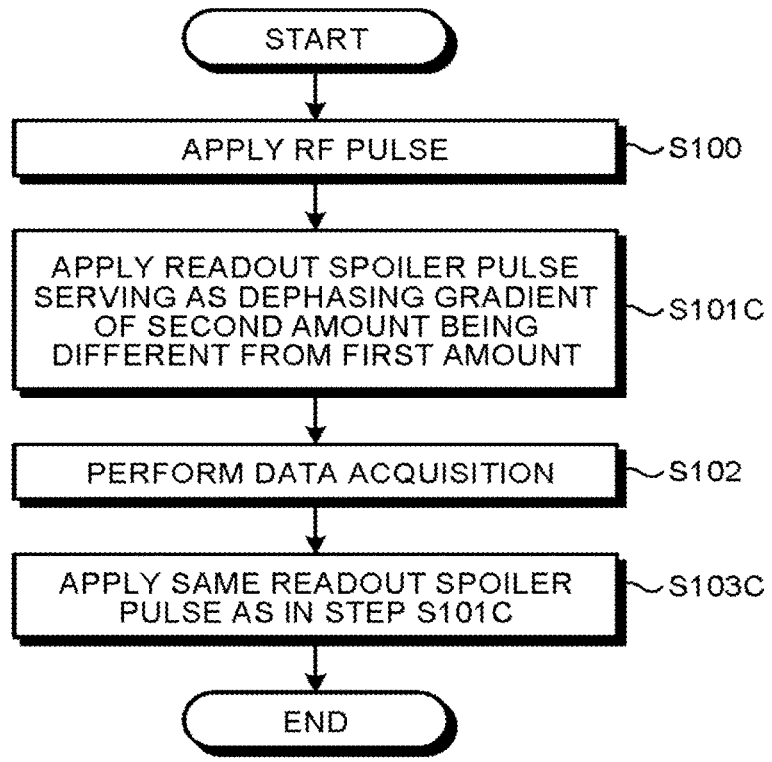

Next, with reference to FIG. 4 to FIG. 6C if necessary, a processing performed by the magnetic resonance imaging apparatus according to the first embodiment is explained. FIG. 4, FIG. 6A and FIG. 6B are flowcharts of explaining a procedure of a processing performed by the magnetic resonance imaging apparatus according to the first embodiment. FIG. 5 is a pulse sequence diagram illustrating a pulse sequence the magnetic resonance imaging apparatus 100 according to the first embodiment executes. Further, FIG. 6C is a drawing illustrating an example of an image generated by the magnetic resonance imaging apparatus 100 according to the first embodiment.

First of all, with reference to FIG. 4, an overall image of the processing is explained. The sequence control circuitry 120 executes a first pulse sequence including a first spoiler pulse (spoiler gradient magnetic field) serving as a dephasing gradient pulse of a first amount (Step S10). Next, the sequence control circuitry 120 executes a second pulse sequence including a second spoiler pulse (spoiler gradient magnetic field) serving as a dephasing gradient pulse of a second amount being different from the first amount (Step S11). The second pulse sequence may be a pulse sequence not including a spoiler pulse serving as the dephasing gradient pulse.

Next, by the image generation function 136, the processing circuitry 150 generates a first data based on the first pulse sequence executed by the sequence control circuitry 120 (Step S12). Further, by the image generation function 136, the processing circuitry 150 generates a second data based on the second pulse sequence executed by the sequence control circuitry 120 (Step S13). Next, the processing circuitry 150 performs a subtraction operation between the first data obtained from the first pulse sequence and the second data obtained from the second pulse sequence, thereby generating an image (Step S14).

The step S10 and the step S11 may be of any order. Similarly, the step S12 and the step S13 may be of any order. The step S10 and the step S11 need not be executed sequentially, but may be executed simultaneously or concurrently. Similarly, the step S12 and the step S13 may not be executed sequentially, but may be executed simultaneously or concurrently.

With reference to FIG. 5A and FIG. 5B, which are pulse sequence diagrams, FIG. 6A, FIG. 6B and FIG. 6C are explained. FIG. 6A is a flowchart explaining the step S10 in detail. FIG. 6B and FIG. 6C are flowcharts explaining step S11 in detail.

FIG. 5A is a pulse sequence diagram in a case the sequence control circuitry 120 applies a pulse sequence without a spoiler pulse as the second pulse sequence. Further, FIG. 5B is a pulse sequence diagram in a case the sequence control circuitry 120 applies a pulse sequence whose spoiler intensity is different from the first pulse sequence as the second pulse sequence.

In either of the cases, the sequence control circuitry 120 incorporates a pulse sequence including a first pulse sequence and a second pulse sequence into one pulse sequence, and executes the one pulse sequence as the one linked sequence.

The top row of FIG. 5A represents RF pulses that are applied and echoes that are generated. An RF pulse 200, an RF pulse 201, an RF pulse 202, an RF pulse 203, an RP pulse 204 are RF pulses applied during a first pulse sequence 560 by the sequence control circuitry 120. An echo 205, an echo 205, an echo 207 and an echo 208 represent echoes generated during the first pulse sequence 560 by the RF pulse 200, the RF pulse 201, the RF pulse 202, the RF pulse 203, respectively. An RF pulse 500, an RF pulse 501, an RF pulse 502, an RF pulse 503 and an RF pulse 504 are RF pulses applied during a second pulse sequence 561 by the sequence control circuitry 120. An echo 510, an echo 511, an echo 512 and an echo 513 represent echoes generated by the RF pulse 500, the RF pulse 501, the RF pulse 502 and the RF pulse 503 during the second pulse sequence 561, respectively.

In the bottom row of FIG. 5A, a readout gradient 210, a readout gradient 211, a readout gradient 212, and a readout gradient 213 indicate readout gradients for data acquisition applied during the first pulse sequence 560 by the sequence control circuitry 120. A center time 215 indicates a center time of the readout gradient 210 for data acquisition. That is, the center time 215 is a time in which a time of start of application of the readout gradient 210 for data acquisition and a time of end of application of the readout gradient 210 for data acquisition are added up and halved. Further, a spoiler pulse 230A, a spoiler pulse 230B, a spoiler pulse 231A and a spoiler pulse 232B are spoiler pulses applied during the first pulse sequence 560 by the sequence control circuitry 120.

Further, a readout gradient 520, a readout gradient 521, a readout gradient 522 and a readout gradient 523 indicate readout gradients for data acquisition applied during the second pulse sequence 561 by the sequence control circuitry 120. In the example of FIG. 5A, in the second pulse sequence 561, the sequence control circuitry 120 does not apply a spoiler pulse.

In the example of FIG. 5A, a case has been explained in which the sequence control circuitry 120 applies a spoiler pulse during the first pulse sequence 560 and the sequence control circuitry 120 does not apply a spoiler pulse during the second pulse sequence 561. However, embodiments are not limited to this situation. For example, the sequence control circuitry 120 may apply a spoiler pulse both in the first pulse sequence 560 and the second pulse sequence 561. In such a case, an explanation is given with reference to FIG. 5B.

The top row of FIG. 5B represents RF pulses that are applied and echoes that are generated. An RF pulse 200, an RF pulse 201, an RF pulse 202, an RF pulse 203, and an RF pulse 204 are RF pulses applied during a first pulse sequence 562 by the sequence control circuitry 120. An echo 205 and an echo 206 represent echoes generated during the first pulse sequence 562 by the RF pulse 200, the RF pulse 201, respectively. An RF pulse 530, an RF pulse 531, an RF pulse 532, an RF pulse 533 and an RF pulse 534, are RF pulses applied during a second pulse sequence 563 by the sequence control circuitry 120.

In the bottom row of FIG. 5B, a readout gradient 210, a readout gradient 211, a readout gradient 212 and a readout gradient 213 represent a readout gradient for data acquisition applied during the first pulse sequence 562 by the sequence control circuitry 120. In the similar manner as in FIG. 5A, a center time 215 in FIG. 5B represents a center time of the readout gradient 210 for data acquisition. Further, a spoiler pulse 230A, a spoiler pulse 230B, a spoiler pulse 231A and a spoiler pulse 232B represent spoiler pulses applied by the sequence control circuitry 120 during the first pulse sequence 562.

Further, a readout gradient 540, a readout gradient 541, a readout gradient 542 and a readout gradient 543 represents readout gradients for data acquisition applied by the sequence control circuitry 120 during the second pulse sequence 563. A spoiler pulse 550A, a spoiler pulse 550B, a spoiler pulse 551A, a spoiler pulse 552B, a spoiler pulse 553A and a spoiler pulse 553B represent spoiler pulses applied by the sequence control circuitry 120 during the second pulse sequence 563.

Subsequently, with reference to FIG. 6A, step S10 of FIG. 4 is explained in detail. FIG. 6A is a more detailed flowchart regarding the step S10 of FIG. 4.

Upon completion of preparation processing for data acquisition, the sequence control circuitry 120 applies an RF pulse, for example, as illustrated in the RF pulse 200 of FIG. 5A or FIG. 5B (Step S100). Next, the sequence control circuitry 120 applies a readout spoiler gradient serving as a dephasing gradient pulse of a first amount, as illustrated in a spoiler pulse 230A as in FIG. 5A or FIG. 5B. (Step S101A). Here, the spoiler pulse 230A includes at least one of a readout spoiler gradient pulse and a phase encode spoiler gradient pulse. As for the case in which the spoiler pulse 230A is a phase encode spoiler gradient pulse, an explanation will be given later in a second modification example of the first embodiment. Here, the sequence control circuitry 120 applies, as the readout spoiler gradient, a readout spoiler gradient of "50%", for example. Here, by 50%, it is meant that the ratio of an application time duration of the readout spoiler gradient to the half of an average time of an application time duration of the readout gradient for data acquisition is 50%. That is, if the application time duration of the readout spoiler gradient (spoiler pulse 230A) is equal to the time from the time of start of application of the readout gradient for data acquisition until the center time 215, then the readout spoiler gradient becomes the readout spoiler gradient of "100%". The longer does an application time duration of the readout spoiler pulse, the more an amount of dephasing becomes. For example, a readout spoiler gradient of "50%" has more dephasing capability (dephasing amount) than a readout spoiler gradient of "40%". The sequence control circuitry 120 may change an intensity of an applied spoiler gradient instead of an application time duration, thereby controlling dephasing capabilities.

Subsequently, the sequence control circuitry 120 applies the readout gradient 210 during a time range in which the echo 205 is generated, thereby performing data acquisition (Step S102). Subsequently, the sequence control circuitry 120 applies the same readout spoiler gradient as that of step S101A, for example, as illustrated in the spoiler pulse 230B of FIG. 5A or FIG. 5B (Step S103A). Consequently, one cycle of acquisition is now finished and acquisition regarding the echo 206, acquisition regarding the echo 207, acquisition regarding the echo 208 will be performed in the same manner.

Next, with reference to FIG. 6B and FIG. 6C, the step S11 of FIG. 4 will be explained in detail. FIG. 6B is a more detailed flowchart of step S11 of FIG. 4 in a case in which the sequence control circuitry 120 does not apply a spoiler pulse during the second pulse sequence 561. Further, FIG. 6C is a flowchart in more detail of processing of step S11 of FIG. 4 when the sequence control circuitry 120 applies a spoiler pulse during the second pulse sequence 563.

First of all, as illustrated in FIG. 5A, with reference to FIG. 6B, a procedure of processing in a case in which the sequence control circuitry does not apply a spoiler pulse during the second pulse sequence 561 is explained.

Upon completion of preparation processing for data acquisition, the sequence control circuitry 120 applies an RF pulse during the second pulse sequence 561, for example, as illustrated in the RF pulse 500 of FIG. 5A (Step S100). Subsequently, the sequence control circuitry 120 moves on to data acquisition without an application of a spoiler pulse.

The sequence control circuitry 120 applies a readout gradient 520 during a time period in which an echo 510 is generated, thereby performing data acquisition (Step S102).

Subsequently, with reference to FIG. 6C, a procedure of processing of a case in which the sequence control circuitry 120 applies a spoiler pulse during the second pulse sequence 563 as illustrated in FIG. 5B.

Having completed preparation processing for data acquisition, the sequence control circuitry 120 applies an RF pulse during the second pulse sequence 563, for example, as in the RF pulse 530 of FIG. 5B (Step S100). Next, the sequence control circuitry 120 applies a readout spoiler gradient pulse serving as a dephasing gradient of a second amount being different from the first amount, as illustrated in the spoiler pulse 550A of FIG. 5B (Step S101B). Here, the spoiler pulse includes at least one of the readout spoiler gradient pulse and the phase encode spoiler gradient pulse. As for the case where the spoiler pulse is a phase encode spoiler gradient pulse, an explanation will be given later in a second modification example of the first embodiment. Here, the sequence control circuitry 120 applies, as the readout spoiler gradient, readout spoiler gradient of, for example, "40%". Here, by 40%, it is meant that the ratio of an application time duration of a readout spoiler gradient to the half of an average time of an application time duration of a readout gradient for data acquisition is 40%. The spoiler pulse applied in the second pulse sequence 563 is "40%", which is smaller than the "50%" of the spoiler pulse applied in the first pulse sequence 562. Thus, the dephasing capability (dephasing amount) of the second pulse sequence 563 is smaller than the dephasing capability (dephasing amount) of the first pulse sequence 562. Consequently, different images are depicted for the second pulse sequence 563 and the first pulse sequence 562.

Next, the sequence control circuitry 120 applies the readout gradient 540 during a time period in which an echo is generated, thereby performing data acquisition (Step S102). Next, the sequence control circuitry 120 applies a same readout spoiler pulse as that of step S101B, as illustrated for example, in the spoiler pulse 550B (Step S103B). Consequently, one cycle of acquisition is now finished and acquisition of each echo will be performed in the similar manner.

Figure 6D:
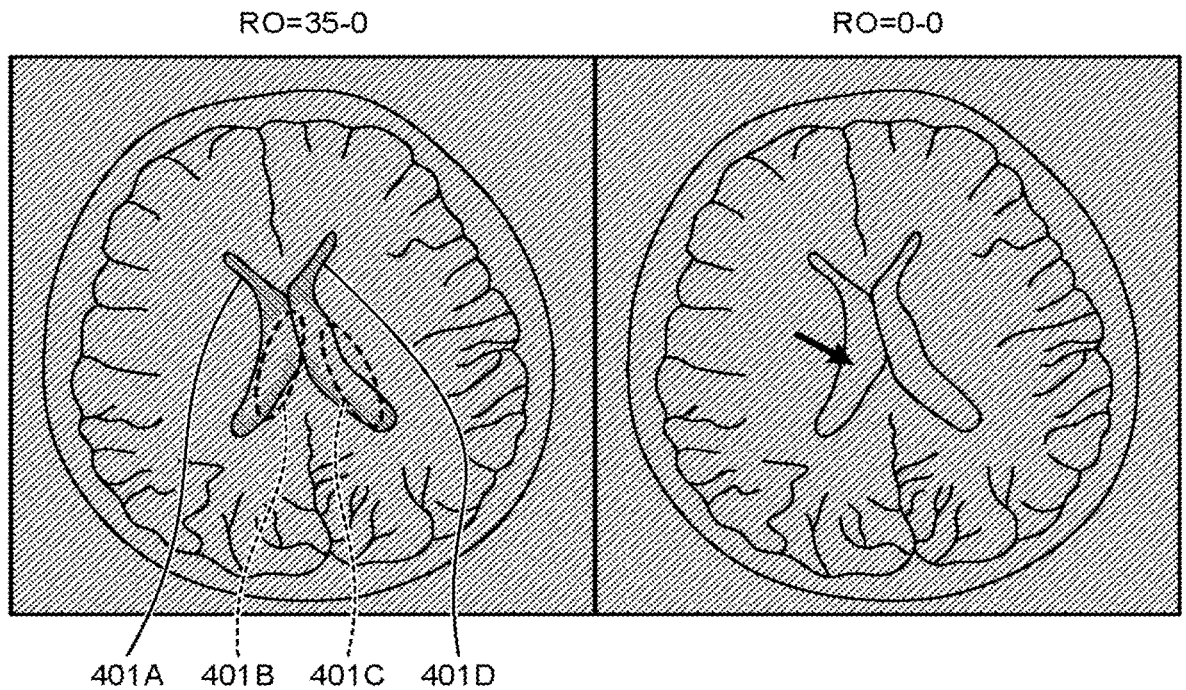
FIG. 6D is a drawing explaining an example of images generated by a magnetic resonance imaging apparatus according to the first embodiment.

FIG. 6D illustrates exemplary images the processing circuitry 150 thus generates at step S14 of FIG. 4 by the image generating function 136. FIG. 6C is an axial cross sectional image of a brain. The right figure of FIG. 6D illustrates a case in which the sequence control circuitry 120 applies a readout spoiler gradient of "0%" as the first pulse sequence and applies a readout spoiler gradient of "0%" as the second pulse sequence. In this case, by the image generation function 136, the processing circuitry 150 generates a first data based on the first pulse sequence of "0%", generates a second data based on the second pulse sequence of "0%", performs a subtraction operation between the first data and the second data, thereby generating an image. The right figure of FIG. 6D is an image that ought to be zero had it not been for noise. Thus it is a reference-purpose image representing a degree of a noise level.

The left figure of FIG. 6D illustrates a case in which the sequence control circuitry 120 applies a readout spoiler gradient of "35%" as the first pulse sequence and applies a readout spoiler pulse of "0%" as the second pulse sequence. In other words, the sequence control circuitry 120 applies a readout spoiler gradient during the first pulse sequence 560. The sequence control circuitry 120 does not apply a readout spoiler gradient during the second pulse sequence 561. Hence, the situation of FIG. 6D corresponds to, for example, a situation of a pulse sequence of FIG. 5A. In this situation, by the image generation function 136, the processing circuitry 150 generates a first data based on the first pulse sequence of "35%" and generates a second data based on the second pulse sequence of "0%", performs a subtraction operation between the first data and the second data, thereby generating an image. As a result, signals of a region choroid plexus exists (a region in a vicinity of a region 401B and a region 401C) become larger than signals of a region choroid plexus does not exist (a region in the vicinity of the sign 401A or sign 401D). Hence, the magnetic resonance imaging apparatus 100 according to the first embodiment depicts CSF production in choroid plexus.

Embodiments are not limited to above-described example. For example, at least one of the sequence control circuitry 120 and the processing circuitry 150 may perform a motion correction. In this case, the sequence control circuitry 120 may perform the motion correction during the data acquisition (prospectively) or after the data acquisition (retrospectively).

A case has been explained in which the sequence control circuitry 120 incorporates a pulse sequence including a first pulse sequence and a second pulse sequence into one pulse sequence and the sequence control circuitry 120 executes the one pulse sequence as one linked sequence. However, embodiments are not limited to these. For example, the sequence control circuitry 120 may execute the first pulse sequence and the second pulse sequence separately instead as one linked sequence.

The sequence control circuitry 120 may execute the first pulse sequence and the second pulse sequence simultaneously or alternately. Here, by the first pulse sequence and the second pulse sequence being executed "simultaneously", it is meant that, for example, within a group of sequence, two scan data are acquired together, with time being shifted for each of the two scans. Further, in this case, a plurality of subsequences exists in one protocol, and after the execution of the one protocol, a plurality of scan data are acquired together. When the sequence control circuitry 120 alternately executes the first pulse sequence and the second pulse sequence, artifacts due to motion become greatly lessened.

As for subtraction processing, by the image generation function 136, the processing circuitry 150 may perform a subtraction processing with respect to amplitudes or with respect to phases. When depicting diffusion weighted different is of significance, the processing circuitry 150 performs subtraction processing with respect to amplitudes. When visualization of motion is of significance, the processing circuitry 150 performs subtraction processing with respect to phases.

As mentioned, in the magnetic resonance imaging apparatus 100 according to the first embodiment, the sequence control circuitry 120 executes a pulse sequence in which the time since application of a pulse sensitizing diffusion phenomena until a time of start of data acquisition of a central k-space is made to be short. In this situation, the sequence control circuitry 120 executes two pulse sequences having different dephasing amounts (dephasing capabilities). By the image generation function 136, the processing circuitry 150 performs subtraction processing between two images in which two pulse sequences are obtained. By this processing, the magnetic resonance imaging apparatus 100 according to the first embodiment can depict various diffusion phenomena, such as production/absorption of CSF (Cerebrospinal Fluid) or water proton transfer from arteries to veins in the capillary bed.

First Modification Example of the First Embodiment

A magnetic resonance imaging apparatus according to a first modification example of the first embodiment modifies the pulse sequence of the first embodiment. The magnetic resonance imaging apparatus according to the first modification example of the first embodiment employs, for example, Time-SLIP (Time Spatial Labeling Inversion Pulse) method to perform a magnetic resonance imaging.

Time-SLIP method is an MRA (Magnetic Resonance Angiography) technology using ASL (Arterial Spin Labeling) method. The sequence control circuitry 120 applies, for a predetermined region to be imaged for a subject, a spatially selective inversion pulse that selectively excites the predetermined region to be imaged, thereby using a "spin-labeling (tagging)" method in which labeled (tagged) blood plays the role of endogenous contrast agent. With this method, the magnetic resonance imaging apparatus 100 according to the first modification example of the first embodiment selectively depicts an imaging region without contrast agents.

Figure 9A:
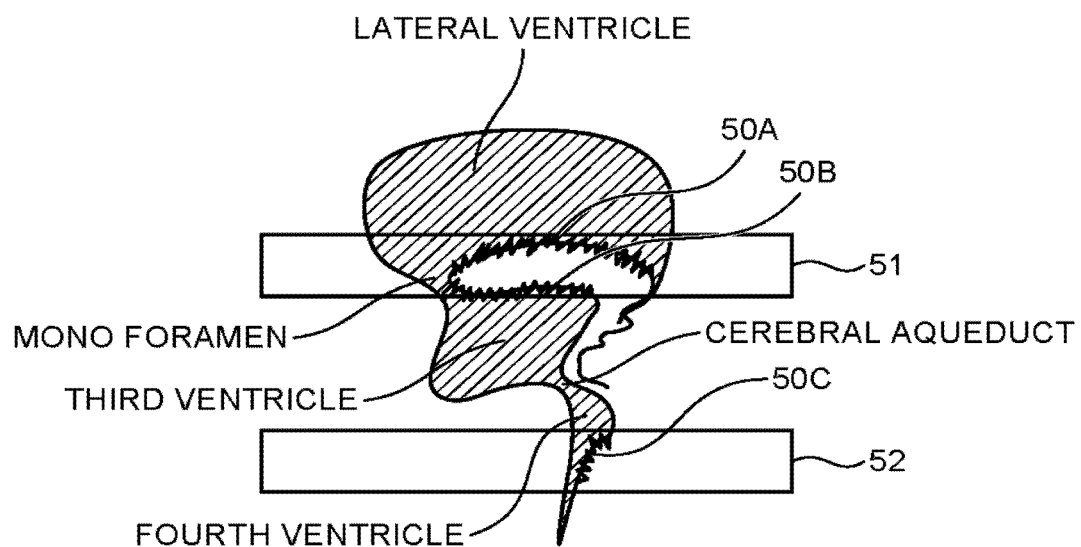
FIG. 9A, FIG. 9B and FIG. 9C are drawings explaining tagging pulses applied by a magnetic resonance imaging apparatus according to the first modification example of the first embodiment.
Figure 9B:
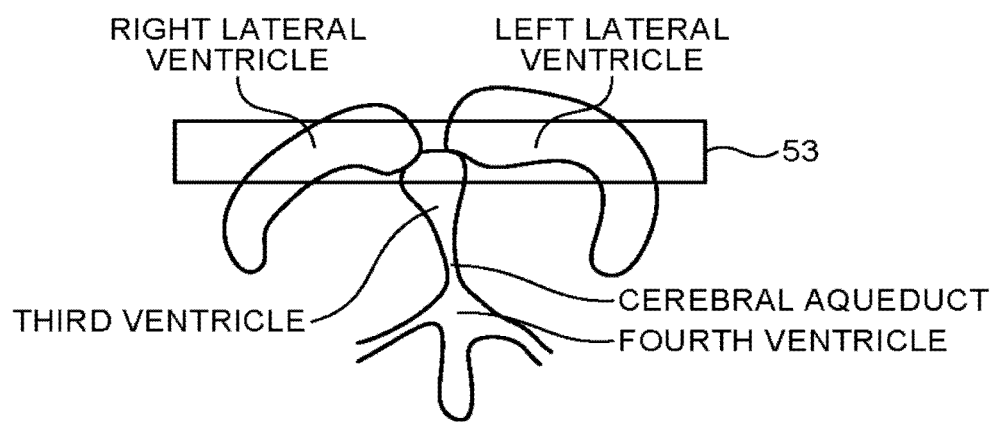
Figure 9C:
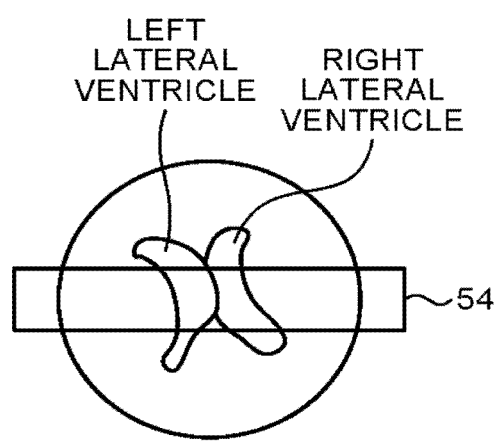

With reference to FIG. 7, FIG. 9A, FIG. 9B and FIG. 9C, the processing of the magnetic resonance imaging apparatus 100 according to the first modification example of the first embodiment is explained using FIG. 8. FIG. 7 is a pulse sequence diagram illustrating a pulse sequence executed by the magnetic resonance imaging apparatus 100 according to the first modification example of the first embodiment. FIG. 8 is a flowchart illustrating a procedure performed by a magnetic resonance imaging apparatus according to the first modification example of the first embodiment. FIG. 9A, FIG. 9B and FIG. 9C are drawings illustrating a tagging pulse applied by a magnetic resonance imaging apparatus according to the first modification example of the first embodiment.

FIG. 7 is a diagram illustrating a pulse sequence the sequence control circuitry 120 executes. In the top row of the FIG. 7, temporal change of the longitudinal magnetization $M_z$ is plotted for a region in which a spatially selective inversion pulse is applied and for a region in which a spatially selective inversion pulse is not applied (in other words, background region). The graph 30 illustrates a temporal change of the longitudinal magnetization in a region in which a spatially selective inversion pulse is applied. The graph 31 illustrate a temporal change of the longitudinal magnetization in a region in which a spatially selective inversion pulse is not applied.

The second row of FIG. 7 illustrates RF pulses that are applied and echoes that are generated. An RF pulse 32 is a spatially non-selective inversion pulse, that is, an inversion pulse non-selectively inverting magnetization of the region to be imaged. Therefore, magnetization is inverted both for a region in which a spatially selective inversion pulse is applied (illustrated by a graph 30) and for a background region (illustrated by a graph 31). An RF pulse 33 is a spatially selective inversion pulse selectively inverting the magnetization within a predetermined region. Thus, in a background region (illustrated by the graph 31), the magnetization is not inverted. However, in a region in which the spatially selective inversion pulse is applied (illustrated by the graph 30), the magnetization is inverted. The magnetization of the background region becomes relaxed, as illustrated by graph 31. The sequence control circuitry 120 performs data acquisition during a time period when a longitudinal magnetization of background signals becomes zero, or at the null-point, thereby reducing noise due to the background signals. In FIG. 0.7, this suitable time period for data acquisition is illustrated. The sequence control circuitry 120 executes the similar pulse sequence to that of FIG. 5A and FIG. 5B, except for applications of the RF pulse 32 and the RF pulse 33.

In the same manner as in FIG. 5A and FIG. 5B, an RF pulse 34 is an RF pulse applied by the sequence control circuitry 120. An echo 35 indicates an echo generated by the RF pulse 34.

The third row from the top in FIG. 7 represents readout gradients of a first pulse sequence. The bottom row in FIG. 7 represents readout gradients of a second pulse sequence.

In the same manner as in FIG. 5A and FIG. 5B, in the third row of FIG. 7, a readout gradient 36 represents a readout gradient for data acquisition. A spoiler pulse 37 and a spoiler pulse 38 represent spoiler pulses.

Similarly, in the bottom row of FIG. 7, a spoiler pulse 40 and a spoiler pulse 39 represent spoiler pulses.

In the first modification example of the first embodiment, the overall procedure of the processing, which is already illustrated in FIG. 4, is similar to the first embodiment. That is, in the first modification example of the first embodiment as well, the sequence control circuitry 120 executes two kinds of pulse sequences. Further, by the image generation function 136, the processing circuitry 150 performs a subtraction processing between the two kinds of data generated from the two kinds of pulse sequences. The difference of the first modification example of the first embodiment from the first embodiment is a difference of pulse sequences applied at step S10 and step S11 of FIG. 4.

Next, with reference to FIG. 8, the processing of step S10 of FIG. 4 in the first modification example of the first embodiment is explained in detail. FIG. 8 is a flowchart in more detail on the processing of step S10 in FIG. 4, in the first modification example of the first embodiment. It is noted that, the processing of step S11 in FIG. 4 in the first modification example of the first embodiment is similar to the processing of step S10 in FIG. 4. Therefore, the explanation is not repeated.

As illustrated in the RF pulse 32 of FIG. 7, the sequence control circuitry 120 applies a spatially non-selective inversion pulse (step S110). Next, the sequence control circuitry 120 applies a spatially selective inversion pulse, as illustrated in the RF pulse 33 (Step S111).

FIG. 9A is a schematic picture of a sagittal cross section of a brain. For example, a sign 50A, a sign 50B and a sign 50C represents a position in which choroid plexus exists. In order to depict CSF production/absorption, the sequence control circuitry 120 applies a spatially selective inversion pulse to a region 51. Further, the sequence control circuitry 120 may apply a spatially selective inversion pulse to a region 52.

An application position of a spatially selective inversion pulse for depicting production/absorption of CSF is not limited to the examples described above. FIG. 9B is a schematic picture of coronal cross section of a brain. The sequence control circuitry 120 may apply a spatially selective inversion pulse to a region 53.

FIG. 9C is a schematic picture of an axial plane cross section of a brain. The sequence control circuitry 120 may, for example, apply a spatially selective inversion pulse to a region 54.

The sequence control circuitry 120 waits until a longitudinal magnetization of background signals relaxes to around a null point, which is a suitable time period for data acquisition (Step S112). The sequence control circuitry 120 repeats step S101C, step S102 and step S103C, until data acquisition time periods terminates. The processing of step S101C, step S102, and step S103 of FIG. 8 are of the same sort of processing as step S101A, step S102 and step S103A in FIG. 6A. Thus, the explanation is not repeated.

In the first modification example of the first embodiment, so-called "flow-out" pulse sequence, in which the sequence control circuitry 120 applies both a spatially selective inversion pulse and a spatially non-selective inversion pulse, has been explained. However, embodiments are not limited to this. For example, the sequence control circuitry 120 may execute a pulse sequence of so-called "flow-in" case, in which the sequence control circuitry 120 applies only the spatially selective inversion pulse and does not apply the spatially non-selective inversion pulse, may be executed.

In the first modification example of the first embodiment, a case in which the magnetic resonance imaging apparatus 100 performs an imaging using Time-SLIP method has been explained. However, embodiments are not limited to this. For example, balanced-SSFP (Steady-State Free Precession) method, True-SSFP method and the like may be employed as the pulse sequence.

In the first modification example of the first embodiment, the sequence control circuitry 120 incorporates the pulse sequence of the first embodiment into a pulse sequence of Time-SLIP method. Hence, the magnetic resonance imaging apparatus according to the first modification example of the first embodiment can depict CSF production/absorption at choroid plexus, by selectively depicting a region of interest without using contrast agents.

Second Modification Example of the First Embodiment

In the first embodiment, the first spoiler pulse and the second spoiler pulse applied by the sequence control circuitry 120 are spoiler gradient pulses of the readout direction. In the second modification example of the first embodiment, a case in which in addition to in the readout direction, spoiler pulses are applied in the phase encode direction or in the slice encode direction. To put it another way, the first spoiler pulse and the second spoiler pulse the sequence control circuitry 120 applies includes at least one of a phase encode spoiler gradient and a slice encode spoiler gradient.

First of all, technical background as to why the sequence control circuitry 120 also applies a spoiler pulse of the phase encode direction and of the slice encode direction is briefly explained.

Let us consider a case in which a spoiler pulse of a phase encode direction is not applied. An application direction of a spoiler pulse corresponds to an orientation in which dephasing occurs. Therefore, an application direction of a spoiler pulse corresponds to an orientation in which a flow and diffusion phenomena are extracted. For example, when a spoiler pulse is applied in a readout direction, a readout component of a flow or diffusion phenomena is emphasized.

Next, let us consider a case in which a spoiler pulse of a phase encode direction is applied. When a spoiler pulse of a phase encode direction is newly applied in addition to a spoiler pulse of a readout direction, the vector of an orientation in which a dephasing occurs is changed from a readout direction to an orientation of a vector sum of a spoiler pulse of a readout direction and a spoiler pulse of a phase encode direction. Thus, an orientation in which flow can be extracted changes. In other words, the sequence control circuitry 120 applies, in addition to a spoiler pulse of a readout direction, a spoiler pulse of a phase encode direction at the same time, thereby controlling in which direction velocity components are depicted and emphasized.

Next, a detail of a pulse sequence the sequence control circuitry 120 according to the second modification example of the first embodiment applies is explained. FIG. 10 is a pulse sequence diagram illustrating a pulse sequence executed by a magnetic resonance imaging apparatus according to the second modification example of the first embodiment.

The top row of FIG. 10 illustrates RF pulses that are applied and echoes that are generated. An RF pulse 60 and an RF pulse 62 are RF pulses applied by the sequence control circuitry 120. An echo 61 illustrates an echo generated by application of the RF pulse 60.

In the bottom row of FIG. 10, a rectangle 68A, a rectangle 68B, a rectangle 68C, a rectangle 68D and rectangle 68G indicate pulses applied by the sequence control circuitry 120 to perform phase encoding. For example, as phase encode corresponding to the echo 61, the sequence control circuitry 120 applies pulses illustrated in the rectangle 68A and the rectangle 68B, thereby performing phase encoding. Further, for example corresponding to the next echo of the echo 61, the sequence control circuitry 120 changes the phase encode amount from the rectangle 68A and the rectangle 68B and applies pulses illustrated in the rectangle 68C and the rectangle 68D, thereby performing phase encoding. Further, corresponding to the next echo, the sequence control circuitry 120 changes the phase encode amount from the rectangle 68C and the rectangle 68D and applies a pulse of a sign 68E and a sign 68F (in other words, does not apply a pulse) and performs a phase encoding.

In the middle row of FIG. 10, a readout gradient 64 illustrates a readout gradient for data acquisition. A rectangular 63 and a rectangular 65 represent spoiler pulses. Similarly, in the bottom row of FIG. 10, a rectangular 66 and a rectangular 67 represent spoiler pulses of the phase direction. In this way, the sequence control circuitry 120 included in the magnetic resonance imaging apparatus 100 according to the second modification example of the first embodiment applies spoiler pulses, for example, in the readout direction and in the phase encode direction simultanesouly.

A case in which the sequence control circuitry 120 applies spoiler pulses in the readout direction and in the phase encode direction has been explained. However, embodiment is not limited to this. For example, the sequence control circuitry 120 may apply spoiler pulses in the readout direction and in the slice encode direction. The sequence control circuitry 120 may apply spoiler pulses in all of the readout direction, phase encode direction and slice encode direction.

Further, the sequence control circuitry 120 need not apply a spoiler pulse in the readout direction. For example, the sequence control circuitry 120 may apply a spoiler pulse only in the phase encode direction. Further, the sequence control circuitry 120 may apply a spoiler pulse only in the slice encode direction.

As has been mentioned above, in the second modification example of the first embodiment, the sequence control circuitry 120 applies a spoiler pulse in a direction other than the readout direction. Hence, in addition to the advantage of the first embodiment, the sequence control circuitry 120 may choose freely an orientation in which a flow is extracted.

Second Embodiment

In the first embodiment, a case in which two kinds of spoiler pulses are used to visualize production/absorption of CSF or protons in capillary bed moving from arteries to veins. In the second embodiment, with a pulse sequence different from the first embodiment, production/absorption of CSF or protons in capillary bed moving from arteries to veins.

Specifically, the sequence control circuitry applies a first MPG pulse and a second MPG pulse at a timing in which a first time is shorter than a second time, the first time being a time since a center time until a time of start of data acquisition of a central k-space, the center time being a center time of a time of application of a first MPG pulse and a time of application of a second MPG pulse, the second time being a time within which at least one of production and absorption of water at CSF and protons moving from arteries to veins at capillary bed are observable.

In other words, if b value is large, only motion-restricted protons are depicted. However, micro-fluid protons are produced or absorbed in a very short time period. Therefore, if data acquisition of a central k-space fails to be started before micro-fluid protons are produced or absorbed, depiction of micro-fluid protons becomes impossible. For example, in CSF, in order to distinguish protons being produced/absorbed and CSF protons already present, it is preferable that a time from a center time of two MPG pulses until a time of start of data acquisition of a central k-space be not more than 5 msec. Further, considering of a fact that blood moves slowly in capillaries, in order to distinguish capillary blood from oxygen-rich blood (arteries) to oxygen-poor blood (veins), it is preferable that a time from a center time of two MPG pulses to a time of start of data acquisition for a central k-space be not more than 10 msec.

In view of the above-described situation, the sequence control circuitry 120 included in the magnetic resonance imaging apparatus 100 according to the second embodiment executes a pulse sequence including a diffusion weighted imaging pre-pulse with MPG such that a time period until a time of start of data acquisition of a central k-space becomes short.

Further, the sequence control circuitry 120 executes two pulse sequences with different amount of MPG. For example, by performing acquisition alternately and performing a subtraction processing thereafter, the sequence control circuitry 120 can improve the image quality.

Figure 12:
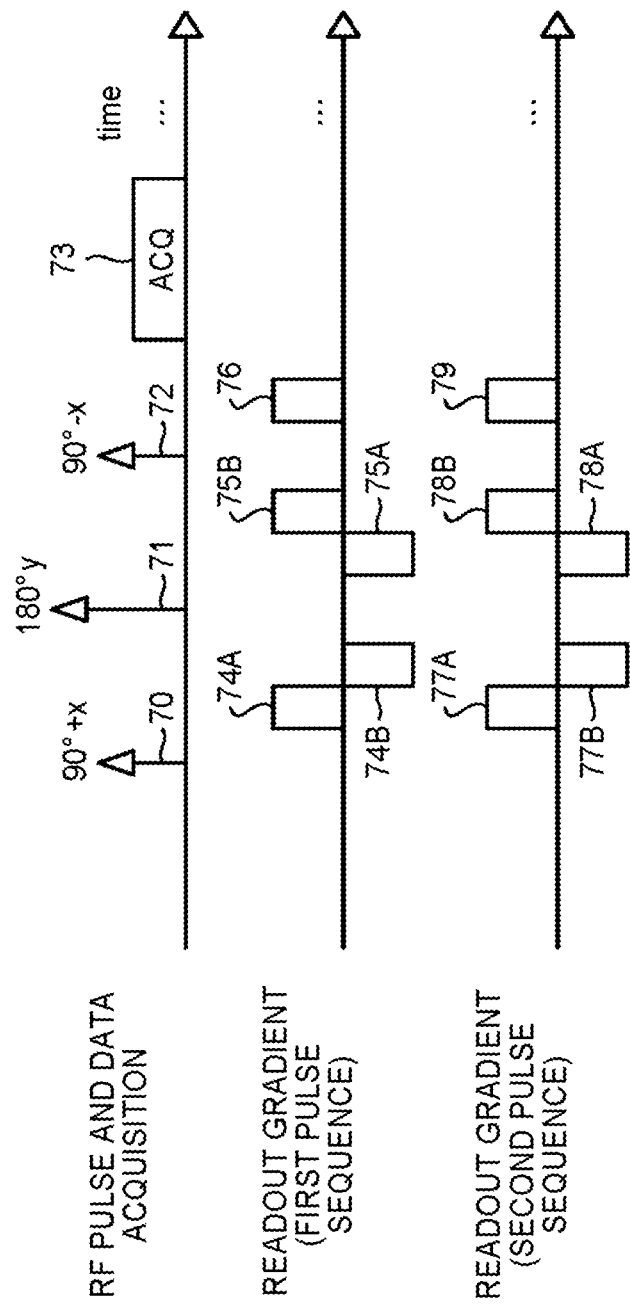
FIG. 12 is a pulse sequence diagram illustrating a pulse sequence executed by a magnetic resonance imaging apparatus according to the second embodiment.
Figure 13C:
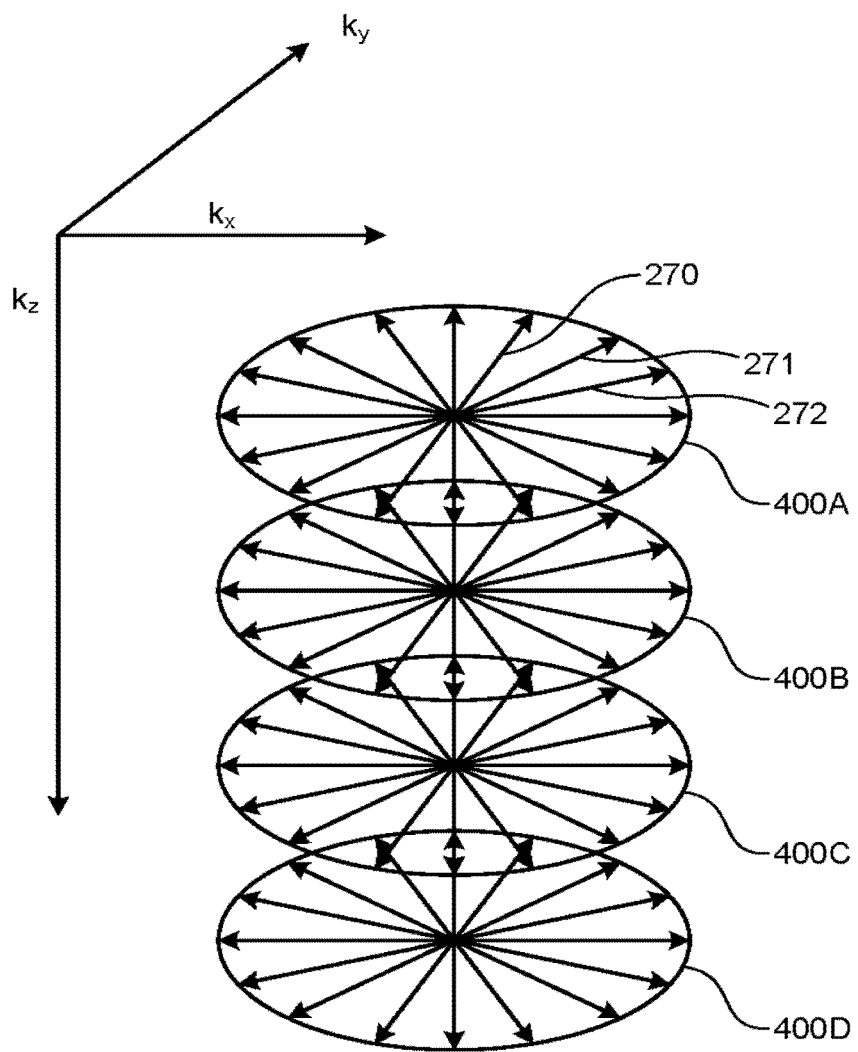
FIG. 13C and FIG. 13D are drawings of explaining samplings performed by a magnetic resonance imaging apparatus according to the second embodiment.
Figure 13D:
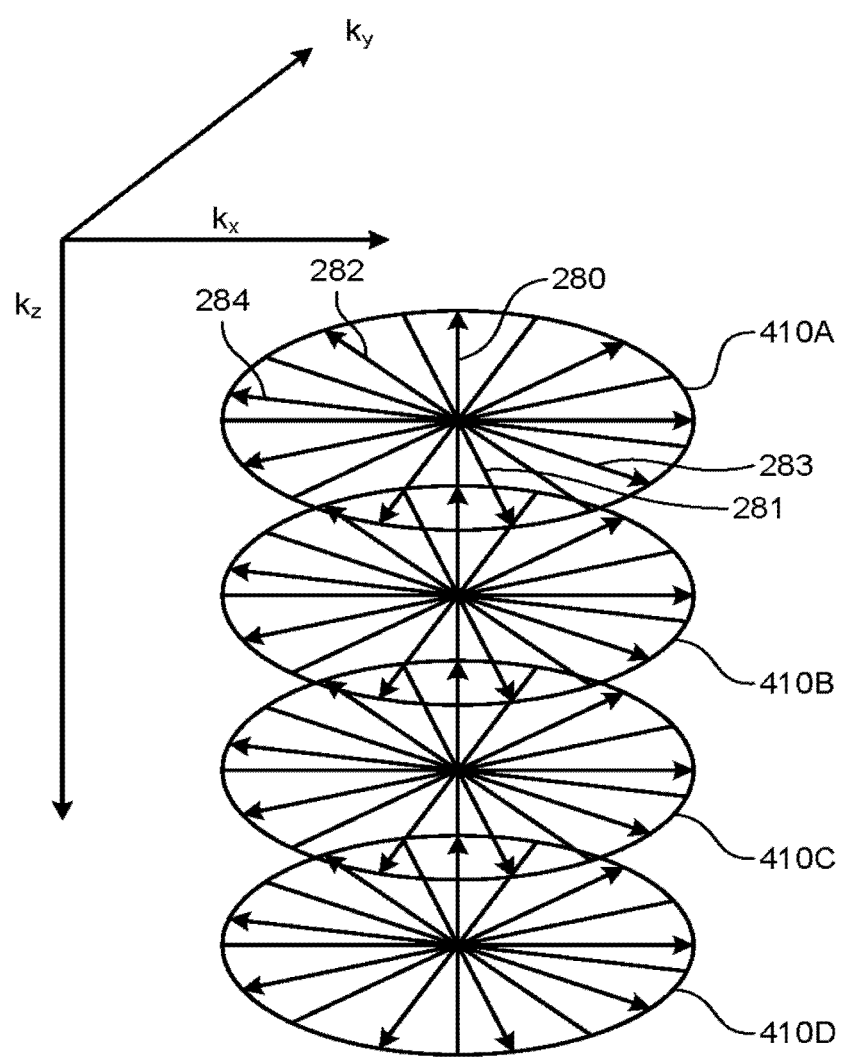

Next, with reference to FIG. 11 to FIG. 13D if necessary, processing performed by the magnetic resonance imaging apparatus according to the second embodiment is explained. FIG. 11, FIG. 13A and FIG. 13B are flowcharts of explaining a procedure of a processing executed by a magnetic resonance imaging apparatus according to the second embodiment. FIG. 12 is a pulse sequence diagram illustrating a pulse sequence executed by a magnetic resonance imaging apparatus according to the second embodiment. FIG. 13C and FIG. 13D are drawings of explaining samplings performed by a magnetic resonance imaging apparatus according to the second embodiment.

First of all, an overall picture the processing is explained with reference to FIG. 11. The sequence control circuitry 120 executes a first pulse sequence characterized by a first b value $b_1$ (Step S20). The first pulse sequence is a pulse sequence in which diffusion weighted imaging is performed including a preparation pulse characterized by the first b value. For example, the sequence control circuitry 120 executes a first pulse sequence characterized by the first b value $b_1$=20. Subsequently, the sequence control circuitry 120 executes a second pulse sequence characterized by a second b value $b_2$ being different from the first b value $b_1$ (Step S21). In other words, the second pulse sequence is the pulse sequence in which diffusion weighted imaging is performed including a preparation pulse characterized by the second b value $b_2$. For example, the sequence control circuitry 120 executes a second pulse sequence characterized by the second b value $b_2$=10. At step S20 and step S21, the sequence control circuitry 120 executes a first pulse sequence and a second pulse sequence including bipolar pulses. Next, by the image generation function 136 the processing circuitry 150 generates a first data based on the first pulse sequence executed by the sequence control circuitry 120 (Step S22). Further, by the image generation function 136, the processing circuitry 150 generates a second data based on the second pulse sequence executed by the sequence control circuitry 120 (Step S23). Next, the processing circuitry 150 performs a subtraction processing between the first data obtained from the first pulse sequence and the second data obtained from the second pulse sequence, thereby generating an image (Step S24).

Note that the step S20 and step S21 (similarly, step S22 and step S23 as well) may be in any order. Further, step S20 and step S21 (similarly step S22 and step S23) need not be executed sequentially, and may be executed simultaneously or concurrently.

Next, as for FIG. 13A, which is a flowchart explaining the step S20 in detail, and FIG. 13B, which is a flowchart explaining the step S21 in detail, an explanation is given with reference to FIG. 12 as appropriate.

The top row of FIG. 12 represents RF pulses that are applied and echoes that are generated. An RF pulse 70 and an RF pulse 72 are 90-degree pulses. An RF pulse 71 is a 180-degree pulse. Echoes are generated by the RF pulse 70, the RF pulse 71 and the RF pulse 72 and data acquisition is performed during a time period illustrated in a rectangle 73.

The middle row of FIG. 12 represents readout gradients of a first pulse sequence. The bottom row of FIG. 12 represents readout gradients of a second pulse sequence.

For example, in the middle row of FIG. 12, gradient magnetic fields 74A and 74B represent a bipolar pulse. Gradient magnetic fields 75A and 75B, which are formed into a pair, represent a first readout pulse sequence.

Similarly, gradient magnetic fields 77A and 77B in the bottom row of FIG. 12 represent a bipolar pulse. Gradient magnetic fields 78A and 78B, which are formed into a pair, represent a second readout pulse sequence. The area of the gradient magnetic field of the first readout pulse sequence (areas of 74A/74B and 75A/75B pairs) and the area of the gradient magnetic field of the second readout pulse sequence (areas of 77A/77B and 78A/78B pairs) are different. Further, a pulse 79 represents a spoiler pulse.

Next, with reference to FIG. 13A, step S20 of FIG. 11 is explained in detail. FIG. 13A is a more detailed flowchart of processing of step S20 of FIG. 11.

The sequence control circuitry 120 applies a first 90-degree pulse, for example, as illustrated in the RF pulse 70 of FIG. 12 (Step S120). Next, the sequence control circuitry 120 applies a first bipolar gradient magnetic field of a pair of bipolar gradient magnetic fields characterized by a first b value $b_1$, as illustrated in the gradients magnetic fields 74A and 74B (Step S121A). Subsequently, the sequence control circuitry 120 applies a 180-degree pulse, as illustrated in the RF pulse 71 (Step S122). Next, the sequence control circuitry 120 applies a second bipolar gradient magnetic field of the pair of bipolar gradient magnetic fields characterized by the first b value $b_1$ and having the opposite polarity of the first bipolar gradient magnetic field (Step S123A). Next, the sequence control circuitry applies a second 90-degree pulse, as illustrated in the RF pulse 72 (Step S120-2). Next, the sequence control circuitry 120 applies a spoiler pulse as in the pulse 76 (Step S124). Finally, the sequence control circuitry 120 performs data acquisition in a region of the rectangle 73.

The sequence control circuitry 120 performs data acquisition at Step S124, for example, not more than about 1 msec. Otherwise, the temporal distance from the center of the two MPG pulses to the data acquisition becomes too long for a purpose of depicting, for example, production/absorption of CSF.

Therefore, the sequence control circuitry 120 performs data acquisition at Step S124 using UTE (Ultrashort TE (Echo Time)) method. As another example, the sequence control circuitry 120 performs a radial scan at Step S124, thereby acquiring a k-space data.

As for FIG. 13C, the sequence control circuitry 120 performs a radial scan, aligning a scan direction such as illustrated by an arrow 270, an arrow 271, an arrow 272 and the like, for one $k_z$ region 400A, from the center of a k-space extending outward. Upon completion of acquisition of the region 400A, the sequence control circuitry 120 performs acquisition shifting the $k_z$ position to perform acquisition, such as a region 400B, a region 400C, a region 400D, and the like, thereby performing the overall three-dimensional k-space.

On the contrary, as for FIG. 13D, the sequence control circuitry 120 performs a scan inverting the scan direction line by line, in other words, so-called "high-low-high" scan, as illustrated in an arrow 280, an arrow 281, an arrow 282, an arrow 283, an arrow 284 and the like, for one $k_z$ region 410A. When acquisition of a region 410A is finished, the sequence control circuitry 120 performs acquisition by changing a $k_z$ position to perform acquisition, such as a region 410B, a region 410C, a region 410C and the like.

Acquisition of FIG. 13C and acquisition of FIG. 13D being compared, a time from a center of the MPG pulses to start of acquisition of a central k-space is considered to be shorter for the former. Thus, in order to depict production/absorption of CSF, the former sampling pattern is considered to be preferable.

Next, with reference to FIG. 13B, the step S21 of FIG. 11 is explained in detail. FIG. 13B is a detailed flowchart regarding a processing of step S21 of FIG. 11.

The sequence control circuitry 120 applies a first 90-degree pulse, for example as illustrated in the RF pulse 70 of FIG. 12 (Step S120). Next, the sequence control circuitry 120 applies a first bipolar gradient magnetic field of a pair of bipolar gradient magnetic field characterized by the second b value $b_2$ being different from the first b value $b_1$ (Step S121B). Similarly to the case described in the first embodiment, one of the values of $b_1$ and $b_2$ may be zero. In that case, the sequence control circuitry 120 does not apply a bipolar pulse sequence in a pulse sequence whose b value becomes zero among the first pulse sequence and the second pulse sequence.

In order to make the second b value $b_2$ being different from the first b value $b_1$, the sequence control circuitry 120 applies MPG pulses such that, for example, the MPG pulse intensity G applied in the second pulse sequence is different from that in the first pulse sequence. As another example, the sequence control circuitry 120 applies MPG pulses such that, for example, an application time duration δ of the MPG pulse applied in the second pulse sequence is different from that in the first pulse sequence. As another example, the sequence control circuitry 120 applies MPG pulses such that the application interval Δ of the MPG pulses applied at the second pulse sequence is different from that in the first pulse sequence.

Next, the sequence control circuitry 120 applies a 180-degree pulse, as illustrated in the RF pulse 71 (Step S122). Next, as illustrated in the gradient magnetic field 78A and the gradient magnetic field 78B, the sequence control circuitry 120 applies a second bipolar gradient magnetic field of the pair of bipolar gradients characterized by the second b value $b_2$, the second bipolar gradient magnetic field having the opposite polarity of the first bipolar gradient magnetic field (Step S123B). Next, as illustrated in the RF pulse 72, the sequence control circuitry 120 applies a second 90-degree pulse (Step S120-2). Next, as illustrated in the RF pulse 79, the sequence control circuitry 120 applies a spoiler pulse (Step S124). Finally, the sequence control circuitry 120 performs data acquisition in a region of the rectangle 73 (Step S125).

In the second embodiment, a case in which sequence control circuitry 120 applies a bipolar gradient magnetic field is explained. However, embodiments are not limited to this situation. For example, the sequence control circuitry 120 may apply a monopolar gradient magnetic field. In the similar manner as in the second embodiment, the sequence control circuitry 120 (or the processing circuitry 150) may perform motion correction. In the second embodiment, a case in which the b value is a predetermined value has been explained. However, embodiments are not limited to this situation. For example, the input device 134 may accept an input of the b value from a user. The input device 134 may send the input value to the sequence control circuitry 120. Thereafter, the sequence control circuitry 120 may execute a pulse sequence corresponding to the input b value. Further, for example, when the input device 134 accepts an input of a range of b value from the user, the input device 134 may send the accepted value to the sequence control circuitry 120. The sequence control circuitry 120 may estimate the b-value of a pulse sequence executed based on a result of the accepted value. For example, when a user sets the b value range as "100-500" and sets the number of image capturing as five, the sequence control circuitry 120 calculates the b value of the pulse sequence to be executed as "100, 200, 300, 400 and 500", based on a result of the acceptance. The sequence control circuitry 120 executes the calculated pulse sequence. In the similar manner as in the first embodiment, the sequence control circuitry 120 may incorporate multiple pieces of acquisition (for example, the first pulse sequence and the second pulse sequence) in one pulse sequence and execute the one pulse sequence.

As described above, the magnetic resonance imaging apparatus 100 according to the second embodiment makes it possible to depict production/absorption of CSF or water proton movement from arteries to veins at capillary bed, using a pulse sequence different from that employed in the first embodiment.

Third Embodiment

In the second embodiment, the sequence control circuitry 120 uses a diffusion weighted imaging preparation pulses, thereby depicting production/absorption of CSF. In a third embodiment, the sequence control circuitry 120 incorporate MPG pulses in the pulse sequence, as in a case of SE-EPI (Spin Echo-Echo Planar Imaging). In other words, the sequence control circuitry 120 incorporates two MPG pulses into a sequence performing diffusion weighted imaging, thereby executing a first pulse sequence and a second pulse sequence. At this time, the sequence control circuitry 120 shortens the time since a center of two MPG pulses until data acquisition. The second embodiment and the third embodiment are common in a sense that the sequence control circuitry 120 executes two pulse sequences having two different b values. However, details of the pulse sequences differ.

Figure 14:
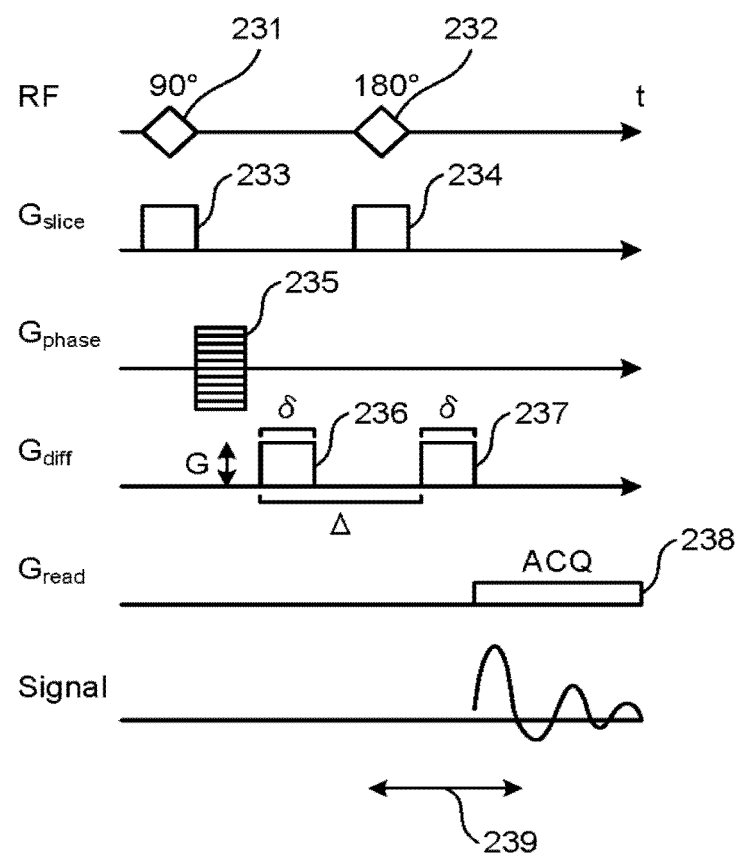
FIG. 14 is a pulse sequence diagram illustrating a pulse sequence executed by a magnetic resonance imaging apparatus according to a third embodiment.

With reference to FIG. 14, a processing performed by the magnetic resonance imaging apparatus 100 according to the third embodiment is explained, using FIG. 15A and FIG. 15B. FIG. 14 is a pulse sequence diagram illustrating a pulse sequence executed by the magnetic resonance imaging apparatus according to the third embodiment. FIG. 15A and FIG. 15B are flowcharts of explaining a procedure of processing performed by a magnetic resonance imaging apparatus according to the third embodiment.

In the third embodiment, the overall procedure of the processing is represented by FIG. 11, in the same manner as in the second embodiment. The difference from the second embodiment is that the pulse sequence the sequence control circuitry 120 uses at step S20 and step S21 is different between the second embodiment and the third embodiment. In the third embodiment, MPG pulses are embedded in the sequence.

Next, with reference to FIG. 14, which is a pulse sequence diagram, FIG. 15A, which is a flowchart explaining in detail step S20 in the third embodiment, and FIG. 15B, which is a flowchart explaining in detail step S21 in the third embodiment, are explained.

The top row of FIG. 14 represents RF pulses to be applied. An RF pulse 231 is a 90-degree pulse and an RF pulse 232 is a 180-degree pulse. Echoes are generated due to the RF pulse 231 and the RF pulse 232. At a time period of a rectangle 238, data acquisition is performed.

A rectangle 233 and a rectangle 234 represent slice gradients to be applied. A sign 235 represents a phase gradient to be applied. A rectangle 236 and a rectangle 237 each represents MPG pulses. Specifically, each gradient magnetic field intensity is G, MPG pulse application time is $\delta$, MPG pulse application interval is $\Delta$.

The rectangle 238 represents a readout gradient (data acquisition). An arrow 239 is a time since a center time of a time of application of the first MPG pulse and time of application of the second MPG pulse until a time of start of data acquisition of a central k-space. The sequence control circuitry 120 executes a pulse sequence, setting a time indicated by an arrow 239 to approximately 1 msec.

FIG. 15A is a flowchart explaining in more detail step S20 of FIG. 11 in the third embodiment. First of all, the sequence control circuitry 120 applies a 90-degree pulse as illustrated in the RF pulse 231. Simultaneously, the sequence control circuitry 120 applies a slice encode gradient magnetic field $G_{slice}$ as illustrated in the rectangle 233 (Step S130). Subsequently, the sequence control circuitry 120 applies a phase encode gradient magnetic field $G_{phase}$ (Step S131). The sequence control circuitry 120 applies a first MPG pulse as illustrated in the rectangle 236, during a time period of $\delta_1$ with an intensity of $G_1$ (Step S132A). Next, the sequence control circuitry 120 applies a 180-degree pulse as illustrated in the RF pulse 232. Simultaneously, the sequence control circuitry 120 applies a slice encode gradient magnetic field $G_{slice}$ (Step S133). The sequence control circuitry 120 applies a second MPG pulse during a time period of $\delta_1$ with an intensity of $G_1$, retarded from the first gradient magnetic field by a time interval of $\Delta_1$, as illustrated in the rectangle 237 (Step S134A). Finally, the sequence control circuitry 120 performs data acquisition in a time period of a rectangle 238 (Step S135).

Further, in the similar manner as described in the first embodiment, one of the b values of the first MPG pulse and the second MPG pulse may be "zero". In this case, the sequence control circuitry 120 does not apply MPG pulses in a pulse sequence in which the b value becomes zero.

FIG. 15B is a flowchart explaining in more detail step S21 of FIG. 11 in the third embodiment. First of all, the sequence control circuitry 120 applies a 90-degree pulse as illustrated in the RF pulse 231. Simultaneously, the sequence control circuitry 120 applies a slice encode gradient magnetic field $G_{slice}$ by the rectangle 233 (Step S130). Subsequently, the sequence control circuitry 120 applies a phase encode gradient magnetic field $G_{phase}$ (Step S131). The sequence control circuitry 120 applies a first MPG pulse as illustrated in the rectangle 236, during a time period of $\delta_2$ with an intensity of $G_2$ (Step S132B). Next, the sequence control circuitry 120 applies a 180-degree pulse as illustrated in the RF pulse 232. Simultaneously, the sequence control circuitry 120 applies a slice encode gradient magnetic field $G_{slice}$ as illustrated in rectangle 234 (Step S133). The sequence control circuitry 120 applies a second MPG pulse during a time period of $\delta_2$ with an intensity of $G_2$, retarded from the first gradient magnetic field by a time interval of $\Delta_2$ as illustrated in rectangle 237 (Step S134B). Finally, the sequence control circuitry 120 performs data acquisition in a time period of the rectangle 238.

As described above, the magnetic resonance imaging apparatus according to the third embodiment can depict, for example, CSF production/absorption or water proton transfer from arteries to veins at capillary bed, by using a pulse sequence playing a different role from that in the first embodiment and the second embodiment.

Computer Programs

Further, the instructions presented in the processing procedures described in the above embodiments may be executed according to a computer program (hereinafter, "program") that is software. It is possible to achieve the same advantageous effects as those from the magnetic resonance imaging apparatus 100 in the above embodiments, by causing a general-purpose computer to store the program therein in advance and to read the program. The instructions described in the above embodiments are recorded as a computer-executable program onto a magnetic disk (e.g., a flexible disk, a hard disk), an optical disc (e.g., a Compact Disc Read-Only Memory [CD-ROM], a Compact Disc Recordable [CD-R], a Compact Disc Rewritable [CD-RW], a Digital Versatile Disk Read-Only Memory [DVD-ROM], a Digital Versatile Disk Recordable [DVD±R], a Digital Versatile Disk Rewritable [DVD±RW]), a semiconductor memory, or the like. Any storage format can be used, as long as a computer or an incorporated system is able to read data from the storage medium. The computer is able to realize the same operations as those performed by the magnetic resonance imaging apparatus 100 described in the above embodiments, by reading the program from the recording medium and having the CPU execute the instructions written in the program according to the read program. Further, when obtaining or reading the program, the computer may obtain or read the program via a network.

Further, according to the instructions in the program installed from the storage medium into the computer or the incorporated system, an Operating System (OS) working in the computer, middleware (MW) such as database management software or a network may execute a part of the processes performed for realizing the embodiments described above. Further, the storage medium does not necessarily have to a medium that is independent of the computer or the incorporated system. The storage medium may be such a storage medium that stores therein or temporarily stores therein the downloaded program transferred via a Local Area Network (LAN), the Internet, or the like. Further, the storage medium does not necessarily have to be one. Even the situation where the processes described in the above embodiments are executed from a plurality of media is included in possible modes of the storage medium implementing the embodiments. The medium/media may have any configuration.

Further, the computer or the incorporated system used in any of the embodiments is configured to execute the processes described in the above embodiments according to the program stored in the storage medium. The computer or the incorporated system may be configured by using a single apparatus such as a personal computer or a microcomputer or may be configured by using a system in which a plurality of apparatuses are connected together via a network. Furthermore, the computer used in any of the embodiments does not necessarily have to be a personal computer and may be an arithmetic processing apparatus, a microcomputer, or the like included in an information processing device. The term "computer" generally refers to any device or apparatus that is capable of realizing the functions described in the embodiments by using the program.

A Hardware Configuration

Figure 16:
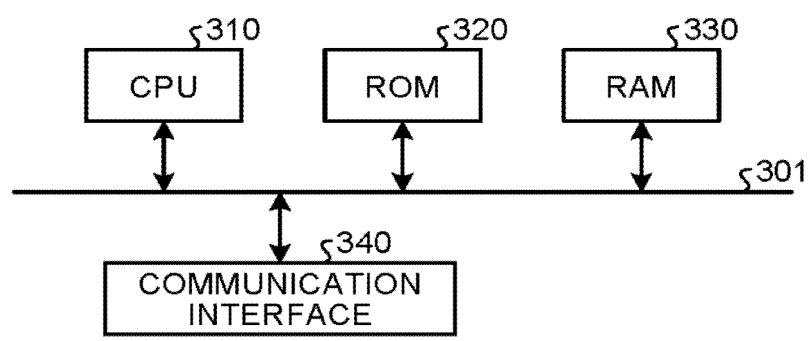
FIG. 16 is a diagram illustrating a hardware configuration of an image processing apparatus according to an embodiment.

FIG. 16 is a diagram of a hardware configuration of a computer 130 (image processing apparatus) according to an embodiment. The image processing apparatus according to the embodiments described above includes a controlling device such as a Central Processing Unit (CPU) 310, storage devices such as a Read-Only Memory (ROM) 320 and a Random Access Memory (RAM) 330, a communication interface (I/F) 340 that connects to a network and performs communication, and a bus 301 that connects the units together.

The program executed by the image processing apparatus according to the embodiments described above is provided as being incorporated, in advance, in the ROM 320 or the like. Further, the program executed by the image processing apparatus according to the embodiments described above is able to cause the computer to function as the units of the image processing apparatus described above. The computer is configured so that the CPU 310 is able to read the program from a computer-readable storage medium into a main storage device and to execute the read program.

According to a magnetic resonance imaging apparatus and a magnetic resonance imaging method according to at least one of the embodiments, it is possible to appropriately depict fluids.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
sequence control circuitry configured to execute a first pulse sequence and a second pulse sequence, the first pulse sequence including a first spoiler pulse serving as a dephasing gradient pulse of a first amount, the second pulse sequence including a second spoiler pulse serving as a dephasing gradient pulse of a second amount that is different from the first amount; and
processing circuitry configured to perform a subtraction operation between first data obtained from the first pulse sequence and second data obtained from the second pulse sequence, thereby generating an image, wherein
the sequence control circuitry is further configured to apply, as the first spoiler pulse or the second spoiler pulse, a spoiler pulse of a phase direction in addition to a spoiler pulse of a readout direction, thereby controlling in which direction velocity components of flow are depicted and emphasized.

2. The magnetic resonance imaging apparatus according to claim 1, wherein the sequence control circuitry is further configured to incorporate a pulse sequence including the first pulse sequence and the second pulse sequence into one pulse sequence and execute the one pulse sequence.

3. The magnetic resonance imaging apparatus according to claim 1, wherein the first spoiler pulse and the second spoiler pulse executed by the sequence control circuitry include a slice encode spoiler gradient pulse.

4. The magnetic resonance imaging apparatus according to claim 1, wherein the first pulse sequence and the second pulse sequence executed by the sequence control circuitry are pulse sequences applying inversion pulses, which are pulses inverting magnetization.

5. The magnetic resonance imaging apparatus according to claim 4, wherein the first pulse sequence and the second pulse sequence executed by the sequence control circuitry are pulse sequences further applying spatially selective inversion pulses that selectively invert magnetization within a predetermined region.

6. The magnetic resonance imaging apparatus according to claim 1, wherein the sequence control circuitry is further configured to execute the first pulse sequence and the second pulse sequence simultaneously.

7. The magnetic resonance imaging apparatus according to claim 1, wherein the sequence control circuitry is further configured to execute the first pulse sequence and the second pulse sequence alternately.

8. The magnetic resonance imaging apparatus according to claim 1, wherein at least one of the sequence control circuitry and the processing circuitry is further configured to perform a motion correction.

9. The magnetic resonance imaging apparatus according to claim 1, wherein the sequence control circuitry is further configured to execute the first pulse sequence and the second pulse sequence with a brain being an object to be imaged, and the processing circuitry is further configured to generate the image depicting CSF (Cerebralspinal Fluid).

10. The magnetic resonance imaging apparatus according to claim 1, wherein the sequence control circuitry is further configured to execute the first pulse sequence and the second pulse sequence with a brain being an object to be imaged, and the processing circuitry is further configured to generate the image depicting CSF produced at choroid plexus.

11. The magnetic resonance imaging apparatus according to claim 1, wherein the processing circuitry is further configured to generate the image, which depicts at least one of lymph fluid, interstitial fluid, and proton movement from arteries to veins at a capillary bed.

12. A magnetic resonance imaging method executed in a magnetic resonance imaging apparatus, the method comprising:
executing a first pulse sequence and a second pulse sequence, the first pulse including a first spoiler pulse serving as a dephasing gradient pulse of a first amount, the second pulse sequence including a second spoiler pulse serving as a dephasing gradient pulse of a second amount that is different from the first amount; and performing a subtraction operation between a first data obtained from the first pulse sequence and a second data obtained from the second pulse sequence, thereby generating an image, wherein the method further comprises:

applying, as the first spoiler pulse or the second spoiler pulse, a spoiler pulse of a phase direction in addition to a spoiler pulse of a readout direction, thereby controlling in which direction velocity components of flow are depicted and emphasized.

* * * * *